(12) United States Patent
Kitagawa

(10) Patent No.: US 8,223,530 B2
(45) Date of Patent: Jul. 17, 2012

(54) VARIABLE-RESISTANCE MEMORY DEVICE AND ITS OPERATION METHOD

(75) Inventor: Makoto Kitagawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 260 days.

(21) Appl. No.: 12/760,262

(22) Filed: Apr. 14, 2010

(65) Prior Publication Data
US 2010/0271861 A1    Oct. 28, 2010

(30) Foreign Application Priority Data

Apr. 22, 2009   (JP) ................................ 2009-103907

(51) Int. Cl.
*G11C 11/00* (2006.01)

(52) U.S. Cl. .... 365/148; 365/158; 365/163; 365/189.09

(58) Field of Classification Search ........................ None
See application file for complete search history.

(56) References Cited

U.S. PATENT DOCUMENTS

| 6,888,773 | B2 * | 5/2005 | Morimoto | 365/218 |
| 7,760,539 | B2 * | 7/2010 | Katoh | 365/148 |
| 7,990,754 | B2 * | 8/2011 | Azuma et al. | 365/148 |

FOREIGN PATENT DOCUMENTS

JP    2007-133930    5/2007

OTHER PUBLICATIONS

K. Aratani et al.; A Novel Resistance Memory with High Scalability and Nanosecond Switching; Technical Digest IEDM 2007; pp. 783-786.

* cited by examiner

*Primary Examiner* — Tan T. Nguyen
(74) *Attorney, Agent, or Firm* — SNR Denton US LLP

(57) ABSTRACT

A variable-resistance memory device includes: memory cells; first wires; a second wire; a drive/control section; and a sense amplifier.

13 Claims, 15 Drawing Sheets

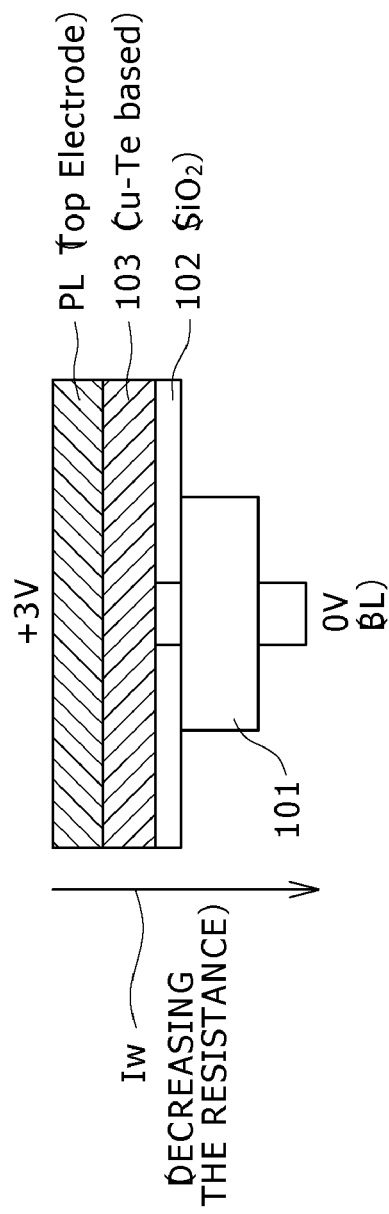
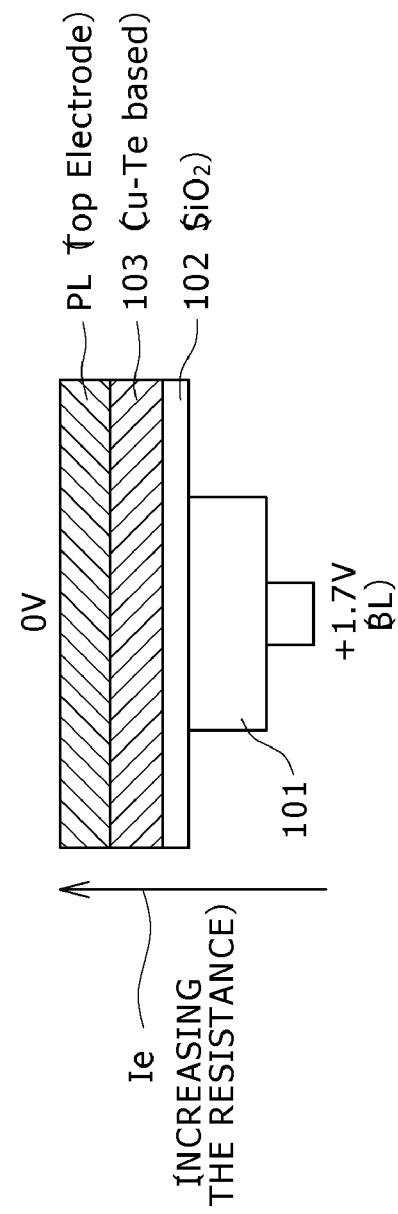

F I G . 4
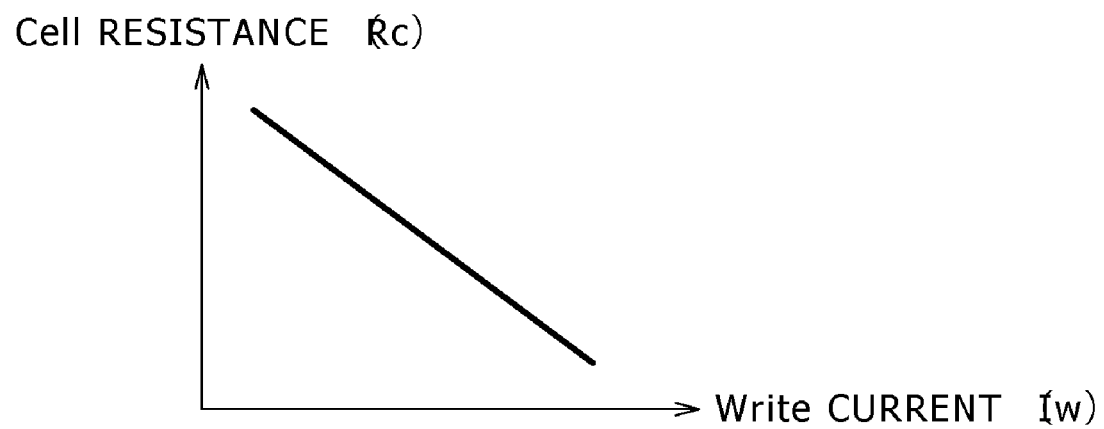

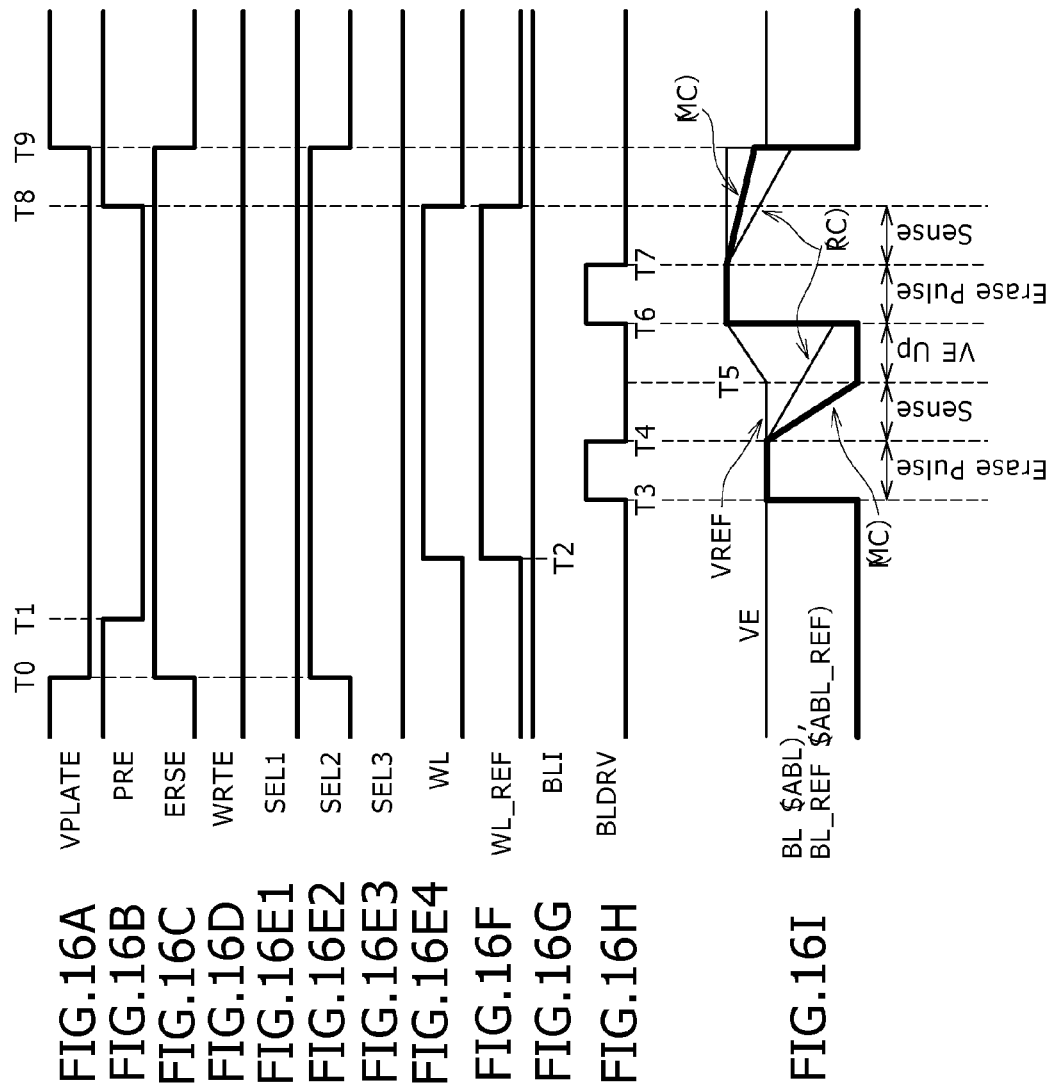

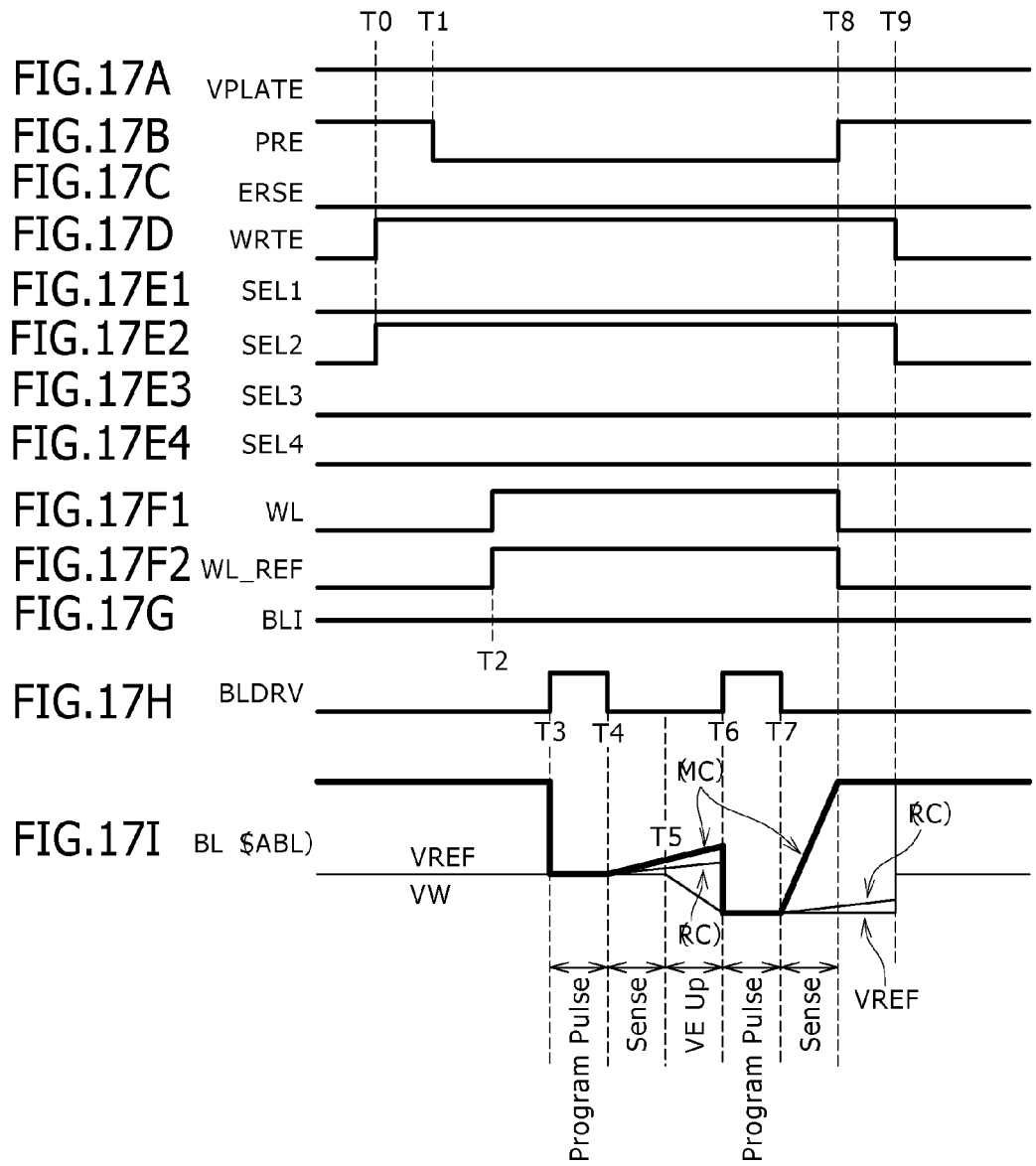

VARIABLE-RESISTANCE MEMORY DEVICE AND ITS OPERATION METHOD

BACKGROUND OF THE INVENTION

1. Field of the Invention

The present invention relates to a variable-resistance memory device employing memory cells each including an access transistor and a data storage element, which is connected in series to the access transistor to serve as a data storage element with a resistance changing in accordance with a voltage applied to the data storage element, and relates to a method for operating the variable-resistance memory device.

2. Description of the Related Art

There has been already known a variable-resistance memory device employing memory cells each including a data storage element which has a resistance changing due to injection of conductive ions into an insulation film of the data storage element or due to extraction of such ions from the insulation film. For more information on this variable-resistance memory device, the reader is suggested to refer to a document such as K. Aratani, etc., "A Novel Resistance Memory with High Scalability and Nanosecond Switching," Technical Digest IEDM 2007, pp. 783-786 (hereinafter referred to as Non-patent Document 1).

The data storage element has a laminated structure constructed by creating a conductive-ion supplying layer and the insulation film cited above between two electrodes of the data storage element.

Every of the memory cell employs a data storage element and an access transistor which are connected to each other in series between first and second wires drivable in an active matrix driving operation. Since the memory cell employs the access transistor (T) and a variable-resistance resistor (R) serving as the data storage element, the memory cell is referred to as a 1T1R-type memory cell.

The variable-resistance memory device employing 1T1R-type memory cells is referred to as a ReRAM (Resistance Random Access Memory).

As described in the document such as Non-patent Document 1, the resistance of a data storage element employed in the ReRAM is used to indicate a state in which data has been stored in the data storage element or a state in which data has been erased from the data storage element. That is to say, the resistance of a data storage element indicates the value of data stored in the data storage element. A data write operation to store data in a data storage element and a data erase operation to erase data from a data storage element can be carried out by applying a pulse having a small width of the order of some ns (nanoseconds) to the data storage element. Thus, since the ReRAM is an NVM (non-volatile memory) capable of operating at as high a speed as a RAM (Random Access Memory), the ReRAM draws much attention.

In the present invention, the data erase operation is defined as an operation carried out to store inverted data in the data storage element employed in the memory cell. The inverted data is data opposite to data stored in the data storage element by carrying out the data write operation. In this specification of the present invention, in case it is not necessary to distinguish the data write operation and the data erase operation from each other, both the data write and data erase operations are referred to as a data update operation which is a generic technical term for them. In the following description, the aforementioned pulse applied to a memory cell to carry out an update operation is also referred to as an update pulse.

In order for the ReRAM to serve as a substitute for a flash memory which is the contemporary NVM of the FG (Floating Gate)_NAND type, however, it is necessary for the ReRAM to surmount several barriers. One of the barriers is a requirement for a good control characteristic of the execution of a high-speed verify operation.

A verify operation is a read operation carried out after application of an update pulse of an update operation in order to read out data from the data storage element in an attempt to verify that the update operation has been carried out normally.

As a method for carrying out a verify operation on a memory cell at a high speed, there is known a method in which residual electric charge remaining on a bit line BL connected to the memory cell after application of an update pulse is discharged through the memory cell in an electrical discharge process, and a voltage change occurring on the bit line BL as a result of the electrical discharge process is detected by making use of a voltage sensor such as a sense amplifier. For more information on this method for carrying out a verify operation at a high speed, the reader is suggested to refer to a document such as Japanese Patent Laid-Open No. 2007-133930 (hereinafter referred to as Patent Document 1).

In accordance with the verify operation method disclosed in Patent Document 1, a verify operation is carried out immediately after application of an update pulse without waiting for a waiting time to lapse. Since there is no waiting time required between the application of an update pulse and the execution of the verify operation, the verify operation can be completed in a short period of time. For this reason, in the following description, the verify operation is referred to as a direct verify operation which means a verify operation carried out immediately after application of an update pulse without waiting for a waiting time to lapse.

SUMMARY OF THE INVENTION

As a sense amplifier that can be used in the verify operation described above, there is known a sense amplifier for detecting an electric potential appearing on the bit line BL by making use of a reference voltage as a comparison reference to be compared with the electric potential.

With control executed in order to change the voltage of an update pulse mentioned earlier, however, even if the change of the resistance of a variable-resistance element serving as the data storage element cited before is sufficiently large, the sense amplifier is not capable of detecting the resistance change by sensing the change of the electric potential appearing on the bit line BL in some cases. Even if the change of the resistance of the variable-resistance element is sufficiently small, on the other hand, the sense amplifier incorrectly detects the resistance change as a significant change to a significant level in some cases.

In order to solve the problem described above, inventors of the present invention have innovated a variable-resistance memory device employing 1T1R memory cells and a sense amplifier capable of detecting a change of the resistance of the data storage element by sensing a change of an electric potential appearing on the bit line BL with a high degree of precision, and innovated a method for operating the variable-resistance memory device.

In accordance with a first embodiment of the present invention, there is provided a variable-resistance memory device which employs memory cells, first wires, a second wire, a drive/control section and a sense amplifier. In the variable-resistance memory device, each of the memory cells has a current path including a data storage element for storing a data in accordance with a resistance variation thereof caused by a voltage applied to the memory cell and including an access transistor connected in series to the data storage element. The first wires are each connected to a specific one of the two ends of the current path. The second wire is connected to the other one of the two ends of the current path. For each of the memory cells, the drive/control section drives and controls: a data write operation to write data into the memory cell by applying a write pulse between the first and second wires in order to cause a write cell current to flow through the memory cell; a data erase operation to erase data from the memory cell by applying an erase pulse between the first and second wires in order to cause an erase cell current to flow through the memory cell; and a direct verify operation to float the first wire right after the data write operation or right after the data erase operation in order to cause a read cell current to flow through the memory cell. The sense amplifier senses an electric-potential change generated on the first wire caused in the direct verify operation by taking a reference voltage, which is generated by the drive/control section in accordance with the operation voltage of the write or erase pulse, as a comparison reference.

It is desirable to implement the variable-resistance memory device according to the first embodiment of the present invention by providing:

an operation-voltage generation/control circuit embedded in the drive/control section to serve as a voltage generation/control circuit for generating the write or erase pulse and changing the operation voltage of the write or erase pulse in accordance with the result of a sensing operation carried out by the sense amplifier on the basis of the control executed by the drive/control section to drive the direct verify operation and/or in accordance with the number of aforementioned sensing operations carried out so far; and a reference-voltage generation/control circuit also embedded in the drive/control section to serve as a voltage generation/control circuit for generating a reference voltage to be supplied to the sense amplifier and changing the reference voltage in accordance with a change of the operation voltage.

In addition, in a first preferred form of the present invention, the reference-voltage generation/control circuit employs a resistor string, which includes a plurality of resistors connected to each other in series, and a divided-voltage select circuit.

With the operation voltage applied to the resistor string as a bias, the divided-voltage select circuit generates a plurality of voltages with the magnitudes thereof different from each other at the same plurality of taps each located at a connection point between every two of the resistors which compose the resistor string. Then, from the generated voltages, the divided-voltage select circuit selects a voltage having a magnitude corresponding to a voltage-division select signal which is supplied to the divided-voltage select circuit. Finally, the divided-voltage select circuit outputs the selected voltage to the sense amplifier as the reference voltage mentioned earlier.

A second preferred form implementing the variable-resistance memory device further includes a reference line, a reference-voltage cell, which is connected between the reference line and the second wire to include a reference-voltage transistor, and a reference-voltage generation/control circuit. The reference-voltage cell generates the reference voltage to be supplied to the sense amplifier whereas the reference-voltage generation/control circuit changes the reference voltage in accordance with the operation voltage.

In accordance with a second embodiment of the present invention, there is provided a method for operating a variable-resistance memory device employing a memory cell having a current path including a data storage element, the data storage element storing a data in accordance with a resistance variation thereof caused by a voltage applied to the memory cell. The method for operating the variable-resistance memory device includes a pulse application step and a direct verify step.

The pulse application step is executed to apply a write pulse or an erase pulse to the memory cell between a first wire connected to a specific one of the two ends of the current path and a second wire connected to the other one of the two ends of the current path to serve as a pulse resulting in a difference in electric potential between the first and second wires.

On the other hand, with the write or erase pulse applied to the memory cell between the first and second wires, the direct verify step is executed by, first of all, putting the first wire in a high-impedance state and, then, detecting an electrical change occurring on the first wire as a change caused by a read current, which flows through the data storage element, by sustaining the high-impedance state of the first wire and by taking a reference voltage generated in accordance with the operation voltage of the write or erase pulse applied to the memory cell as a comparison reference.

In accordance with the present invention, it is possible to provide a variable-resistance memory device employing 1T1R memory cells and a sense amplifier capable of detecting a voltage change with a high degree of precision and provide a method for operating the variable-resistance memory device.

BRIEF DESCRIPTION OF THE DRAWINGS

FIGS. 3A and 3B are a plurality of diagrams each showing a cross section of a variable-resistance cell resistor serving as a data storage element employed in a memory cell and showing the operation of the data storage element;

FIG. 4 is a diagram showing a graph representing dependence of the cell resistance of the data storage element on a write current flowing through the data storage element;

FIGS. 16A to 16I are a plurality of diagrams showing the same plurality of waveforms each representing a timing chart of a signal used in a sequence of data erase operations each immediately followed by a direct verify erase operation carried out in accordance with the second embodiment; and FIGS. 17A to 17I are a plurality of diagrams showing the same plurality of waveforms each representing a timing chart of a signal used in a sequence of data write operations each immediately followed by a direct verify write operation carried out in accordance with the second embodiment.

DETAILED DESCRIPTION OF THE PREFERRED EMBODIMENTS

Preferred embodiments of the present invention are explained by referring to the diagrams in chapters which are arranged as follows:

1. First Embodiment

A first embodiment implements a ReRAM having a reference-voltage generation/control circuit for generating a reference voltage by voltage division based on resistances.

2. Second Embodiment

A second embodiment implements a ReRAM having a reference-voltage generation/control circuit for controlling a reference voltage by creating an electrical discharge path through a reference-voltage memory cell included in an array of memory cells at a reference-voltage generation time and generating a mirror current to flow through (a path simulating) the electrical discharge path.

3. Modified Versions

1. First Embodiment

Memory-Cell Configuration

Figure 1A:
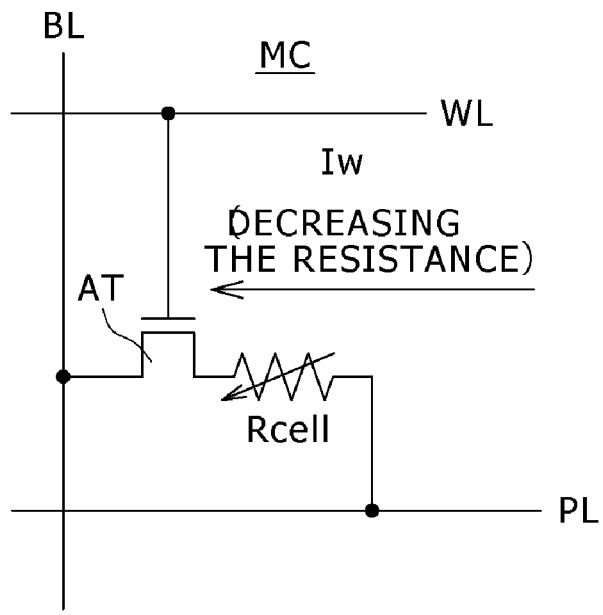
FIGS. 1A and 1B are a plurality of circuit diagrams each showing an equivalent circuit of a memory cell which is common to first and second embodiments implementing a variable-resistance memory device including the memory cell as well as modified versions of the embodiments.
Figure 1B:
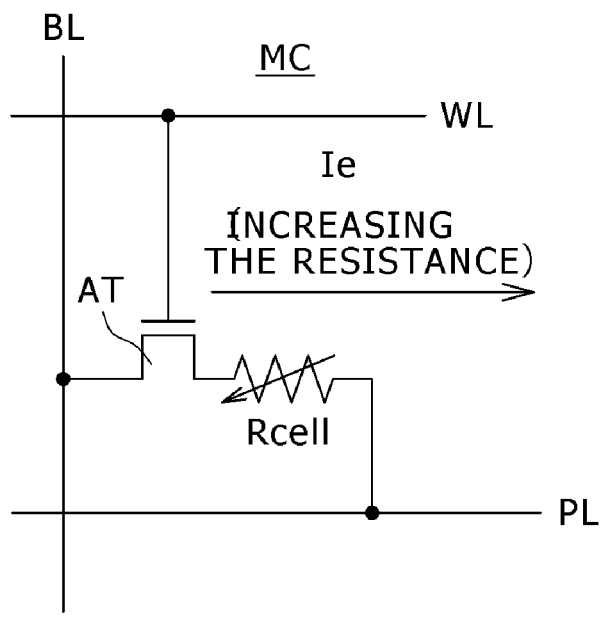

FIGS. 1A and 1B are a plurality of circuit diagrams each showing an equivalent circuit of a memory cell MC which is common to first and second embodiments as well as modified versions of the embodiments. It is to be noted that, even though FIG. 1A is a circuit diagram showing a write current Iw flowing in the equivalent circuit of the memory cell MC whereas FIG. 1B is a circuit diagram showing an erase current Ie flowing in the equivalent circuit of the memory cell MC in a direction opposite to the direction of the write current Iw, the memory-cell configuration shown in the circuit diagram of FIG. 1A is identical with the memory-cell configuration shown in the circuit diagram of FIG. 1B.

Each of the memory cells MCs shown in the circuit diagrams of FIGS. 1A and 1B employs a variable-resistance cell resistor Rcell and an access transistor AT. The variable-resistance cell resistor Rcell functions as a data storage element having a variable resistance.

A specific one of the two ends of the variable-resistance cell resistor Rcell is connected to a plate line PL whereas the other one of the two ends is connected to the source of the access transistor AT. The drain of the access transistor AT is connected to a bit line BL whereas the gate of the access transistor AT is connected to a word line WL which is used as an access line.

The bit line BL is a typical example of the first wire mentioned before whereas the plate line PL is a typical example of the second wire cited earlier. It is to be noted that, even though the bit line BL and the plate line PL are oriented in directions perpendicular to each other in the diagrams of FIGS. 1A and 1B, the bit line BL and the plate line PL can be actually oriented in directions parallel to each other.

Figure 2:
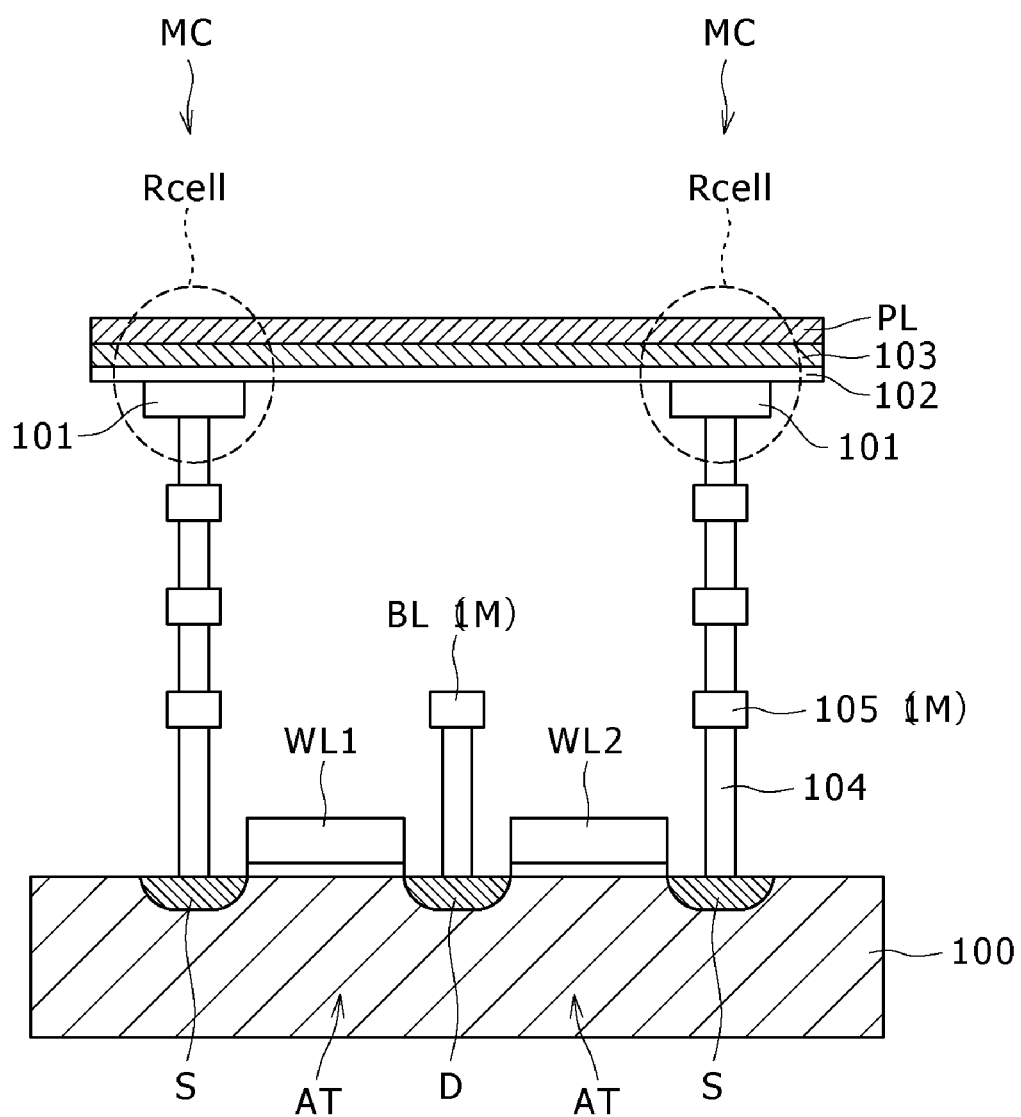
FIG. 2 is a diagram showing a cross section of two adjacent memory cells included in the variable-resistance memory device.

FIG. 2 is a diagram showing a cross section of two adjacent memory cells MC included in a variable-resistance memory device. To be more specific, FIG. 2 is a diagram showing a cross section of a model which represents two adjacent memory cells MC and includes no hatched portions. In particular, each of blank portions shown in the cross-sectional diagram of FIG. 2 as portions including nothing is filled with an insulation film or used as another component (or a part of the other component).

In each of the memory cells MC shown in the cross-sectional diagram of FIG. 2, the access transistor AT is created on a semiconductor substrate 100.

To put it in more detail, two impurity areas to be used as the source S of the access transistor AT and the drain D of the access transistor AT respectively are created on the semiconductor substrate 100. In a middle substrate area between the source S and the drain D, a gate electrode is created from a material such as polysilicon, being separated away from the middle substrate area by a gate insulation film. The two gate electrodes each created in the memory cell MC serve as word lines WL1 and WL2 respectively.

The two access transistors AT in the two memory cells MC respectively share the same drain D which is connected to a bit line BL created as a first-wire layer 1M.

On the source S of the access transistor AT, a plug 104 and a landing pad 105 are heaped up repeatedly to form a stack. The landing pad 105 is typically a wire layer. On the stack, a variable-resistance cell resistor Rcell is created. The number of pairs each consisting of a plug 104 and a landing pad 105 heaped up in the stack on which a variable-resistance cell resistor Rcell is created is determined arbitrarily. Typically, the number of such pairs is four or five.

The variable-resistance cell resistor Rcell is created between a lower electrode 101 and an upper electrode which serves as the plate line PL. The variable-resistance cell resistor Rcell has a film configuration including an insulation film 102 connected to the lower electrode 101 and a semiconductor film 103 connected to the plate line PL.

Typical examples of a material used for making the insulation film 102 are SiN, $SiO_2$ and $Gd_2O_3$.

On the other hand, typical examples of a material used for making the semiconductor film 103 are a metallic film, an alloy film and a metallic compound film. The metallic film is typically a film containing one or more metallic elements such Cu, Ag and Zn. A typical example of the alloy film is an alloy film made of CuTe. It is to be noted that metallic elements other than Cu, Ag and Zn can also be used for making the semiconductor film 103 provided that each of the other metallic elements has a property allowing the metallic element to be ionized with ease. In addition, it is desirable to make use of at least one of S, Se and Te as an element to be combined with at least one of Cu, Ag and Zn. The semiconductor film 103 is created as a layer for supplying conductive ions.

FIGS. 3A and 3B are a plurality of diagrams each showing an enlarged cross section of the variable-resistance cell resistor Rcell serving as a data storage element and showing the operation of the data storage element Rcell.

In each of the typical examples shown in the diagrams of FIGS. 3A and 3B, the insulation film 102 is created from $SiO_2$ whereas the semiconductor film 103 is made from a Cu—Te based alloy compound which is a compound based on a Cu—Te alloy.

In the cross-sectional diagram of FIG. 3A, a voltage is applied between the lower electrode 101 and the upper electrode, which serves as the plate line PL, in such a direction that the insulation film 102 and the semiconductor film 103 are used as a cathode and an anode respectively. For example, the bit line BL linked to the lower electrode 101 wired to the insulation film 102 is connected to the ground GND having an electric potential of 0 V whereas the plate line PL linked to the semiconductor film 103 receives an electric potential of +3 V.

With the semiconductor film 103 and the lower electrode 101 set at electric potentials of +3 V and 0 V respectively as described above, the variable-resistance cell resistor Rcell exhibits a characteristic allowing Cu, Ag and/or Zn which are included in the semiconductor film 103 to be ionized and attracted by the insulation film 102 serving as the cathode. Thus, the conductive ions of these metals are injected into the insulation film 102. Accordingly, the insulating characteristic of the insulation film 102 deteriorates, bringing about a conductive characteristic to the insulation film 102. As a result, a write current Iw flows in a direction indicated by an arrow shown in the cross-sectional diagram of FIG. 3A. This operation in which the write current Iw is flowing is referred to as a data write operation or a data set operation.

In a state shown in the cross-sectional diagram of FIG. 3B, on the other hand, a voltage is applied between the lower electrode 101 and the upper electrode, which serves as the plate line PL, in such a direction that the insulation film 102 and the semiconductor film 103 are used as an anode and a cathode respectively. For example, the bit line BL linked to the lower electrode 101 wired to the insulation film 102 receives an electric potential of +1.7 V whereas the plate line PL linked to the semiconductor film 103 is connected to the ground GND having an electric potential of 0 V.

With the semiconductor film 103 and the lower electrode 101 set at electric potentials of 0 V and +1.7 V respectively as described above, ions injected into the insulation film 102 are returned to the semiconductor film 103 and the resistance of the variable-resistance cell resistor Rcell is reset to its original large value prevailing prior to the data write operation. In this state, an erase current Ie is flowing in a direction indicated by an arrow shown in the cross-sectional diagram of FIG. 3B. This operation in which the erase current Ie is flowing is referred to as a data erase operation or a data reset operation.

It is to be noted that, in general, the data set operation is an operation to sufficiently inject conductive ions into the insulation film 102 in order to establish a set state whereas the data reset operation is an operation to sufficiently extract conductive ions from the insulation film 102 in order to establish a reset state.

On the other hand, it is possible to arbitrarily select a set or reset state as a written-data state or an erased-data state. To put it more concretely, a written-data state can be defined as a set state whereas an erased-data state can be defined as a reset state. As an alternative, a written-data state is conversely defined as a reset state whereas an erased-data state is conversely defined as a set state.

In the following description, the written-data state is defined as a set state which is established by decreasing the insulating characteristic of the insulation film 102 so as to reduce the resistance of the entire variable-resistance cell resistor Rcell to a sufficiently small value whereas, conversely, the erased-data state is defined as a reset state which is established by restoring the insulating characteristic of the insulation film 102 to its original level prevailing in the initial state so as to increase the resistance of the entire variable-resistance cell resistor Rcell to a sufficiently large value.

For the reason described above, the insulation film 102 can be said to be a typical implementation of a variable-resistance layer.

The directions of the arrows each indicating the direction of a current flowing through the variable-resistance cell resistor Rcell as shown in the circuit diagrams of FIGS. 1A and 1B agree with the directions of the arrows each indicating the direction of a current flowing through the variable-resistance cell resistor Rcell as shown in the cross-sectional diagrams of FIGS. 3A and 3B.

As shown in a diagram of FIG. 4, the resistance of the entire variable-resistance cell resistor Rcell changes with the magnitude of the write current Iw. In the following description, the resistance of the entire variable-resistance cell resistor Rcell is also referred to simply as a cell resistance Rc. Since the cell resistance Rc changes with the magnitude of the write current Iw linearly to a certain degree, by controlling the write current Iw, the variable-resistance cell resistor Rcell can be used for storing a number of different values. For example, the variable-resistance cell resistor Rcell can be used for storing three or more different values.

By changing the resistance of the variable-resistance cell resistor Rcell from a small value to a large value or vice versa in a reversible manner, it is possible to establish the aforementioned set and reset states which can be associated with two stored values respectively. That is to say, the variable-resistance cell resistor Rcell can be used as a two-value data storage element. In addition, the set and reset states of exhibiting respectively the large and small cell resistances Rc representing respectively two different values of data stored in the memory cell MC are sustained even if a voltage applied to the variable-resistance cell resistor Rcell is removed. Thus, the memory cell MC functions as a nonvolatile memory.

It is to be noted that, in an actual data set operation, the resistance of the insulation film 102 of the variable-resistance cell resistor Rcell changes in accordance with the number of metallic ions injected into the insulation film 102. Thus, the insulation film 102 can be regarded as an actual storage layer used for storing data.

A memory cell MC is constructed by making use of a variable-resistance cell resistor Rcell, and a number of such memory cells MC are laid out to form a memory-cell matrix which is used as a core portion of a variable-resistance memory device. In addition to the memory-cell matrix, the variable-resistance memory device includes driving circuits which are each referred to as a peripheral circuit.

Incidentally, if the data write (or erase) operation is carried out a number of times repeatedly on the variable-resistance cell resistor Rcell having the configuration shown in the diagrams of FIGS. 1A to 3B, the cell resistance Rc of the variable-resistance cell resistor Rcell in the set state of exhibiting a small resistance as a result of the data write operation may be set at a value smaller than a level presumed in advance in some cases.

However, the embodiments are provided in order to cope with the problem of an unintended change caused by a data update (write or erase) operation to write data into the memory cell MC or erase data from the memory cell MC as a change in cell resistance Rc. To put it in detail, after completing a direct verify operation performed right after a specific data write operation or a specific data erase operation, it is desirable to carry out an additional data write operation or an additional data erase operation right after the direct verify operation on the basis of a result of the direct verify operation. In addition (or as an alternative), in order to cope with the problem of an unintended change caused by a data update (that is, write or erase) operation to write data into the memory cell MC or erase data from the memory cell MC as a change in cell resistance Rc, it is desirable to carry out driving control to gradually increase a write or erase voltage which is applied between the bit line BL and the plate line PL.

Direct Verify Operation

In the embodiment of the present invention, for the verify operation, the sense amplifier SA adopts a method in accordance with which residual electric charge remaining on the bit line BL right after application of an update pulse (that is, a write pulse or an erase pulse) to perform a data update (that is, write or erase) operation is discharged through the memory cell MC to the plate line PL during a fixed period of time, and a voltage change occurring on the bit line BL as a change resulting from the electrical discharge process is detected in order to determine whether or not the data update operation has been performed successfully. In accordance with this method, a special process of electrically pre-charging the bit line BL for the verify operation is thus not required. For this reason, in the following description, the verify operation according to the present invention is referred to as a direct verify operation.

As an alternative, for the direct verify operation, the sense amplifier SA may also adopt another method in accordance with which electric charge accumulated on the plate line PL is reversely transferred to the bit line BL after application of an update pulse (that is, a write pulse or an erase pulse) for performing a data update operation through the memory cell MC during a fixed period of time, and a voltage change occurring on the bit line BL as a voltage change resulting from the electrical transfer process is detected in order to determine whether or not the data update operation has been performed successfully. In addition, instead of driving the sense amplifier SA to carry out an operation to sense a voltage, an operation to sense a current can also be performed.

The following description explains a typical configuration in which, for a data write operation, electric charge accumulated on the plate line PL is transferred to the bit line BL having an electric potential lower than an electric potential appearing on the plate line PL after application of a write pulse for performing the data write operation through the memory cell MC during a fixed period of time, and a voltage change occurring on the bit line BL as a voltage change resulting from the electrical transfer process is detected by the sense amplifier SA in a direct verify operation immediately following the data write operation in order to determine whether or not the data write operation has been performed successfully.

For a data erase operation, on the other hand, electric charge accumulated on the bit line BL is discharged to the plate line PL having an electric potential lower than an electric potential appearing on the bit line BL after application of an erase pulse for performing the data erase operation through the memory cell MC during a fixed period of time, and a voltage change occurring on the bit line BL as a voltage change resulting from the electrical discharge process is detected by the sense amplifier SA in a direct verify operation immediately following the data erase operation in order to determine whether or not the data erase operation has been performed successfully.

The variable-resistance memory device according to the embodiment employs a drive/control section for controlling the direct verify operation in addition to the data update operation itself. In addition, the variable-resistance memory device also includes the aforementioned sense amplifier SA which is denoted by reference numeral 7 in a block diagram of FIG. 5 to be described later. The sense amplifier SA is a section for sensing an electric potential originating from the bit line BL and appearing on the sense node of the sense amplifier SA by making use of a reference voltage given to the reference node of the sense amplifier SA as a comparison reference to be compared with the electric potential. It is to be noted that the reference voltage can be generated by a source external to the variable-resistance memory device. It is desirable, however, to provide the drive/control section employed in the variable-resistance memory device with a reference-voltage generation/control circuit embedded in the drive/control section to serve as a circuit for generating the reference voltage. The reference-voltage generation/control circuit will be described later in detail.

It is desirable to provide the drive/control section with a write/erase driver for properly generating a driving-pulse voltage to be set next on the bit line BL serving as the first wire for a case in which an additional driving pulse is required to serve as an update pulse mentioned before and for properly generating no driving-pulse voltage for a case in which an additional driving pulse is not required in accordance with a voltage sensing result produced by the sense amplifier SA. In some cases, the write/erase driver has a circuit configuration for generating a driving-pulse voltage which does not change for a sequence of consecutive data update operations. In the case of the embodiment, however, the write/erase driver has a circuit configuration for generating a driving-pulse voltage which is increased gradually in accordance with the number of direct verify operations each carried out so far right after one of consecutive data update operations. As is obvious from the above description, the driving-pulse voltage is the voltage of an update pulse to be applied between the bit line BL and the plate line PL which are connected to the memory cell MC. In the following description, the driving-pulse voltage which is the voltage of an update pulse is also referred to as an operation voltage. The write/erase driver is a section for applying the operation voltage originated from the aforementioned operation-voltage generation/control circuit employed in the drive/control section provided by the present invention to the bit line BL.

In addition, it is desirable to configure the write/erase driver to discontinue the operation to apply an additional operation voltage to the bit line BL in accordance with a detection result produced by the sense amplifier SA. To put it in detail, it is desirable to provide the write/erase driver with an inhibit control function to thereafter terminate the operation to apply an additional operation voltage if the sense amplifier SA produces a voltage detection result which determines that the most recent data write or erase operation has been carried out successfully to adequately update the data stored in the memory cell MC. That is to say, the SA (sense amplifier) carries out inhibit control to determine whether or not to thereafter discontinue the operation to apply an additional operation voltage to the bit line BL in accordance with the result of voltage detection performed by the SA (sense amplifier) 7. The inhibit control will be described later in detail.

On top of that, the drive/control section also includes a plate driver for applying a voltage to the plate line PL. The plate driver will be explained later in detail.

By referring to a chip block diagram, the following description explains a typical implementation of an IC chip including the SA (sense amplifier) as well as the drive/control section which has the plate driver cited above and the write/erase driver for applying the operation voltage generated by the operation-voltage generation/control circuit to the bit line BL. The drive/control section included in the typical IC chip described below also has the aforementioned reference-voltage generation/control circuit to serve as a circuit for generating the reference voltage to be used by the SA (sense amplifier) as a comparison reference.

IC-Chip Configuration

Figure 5:
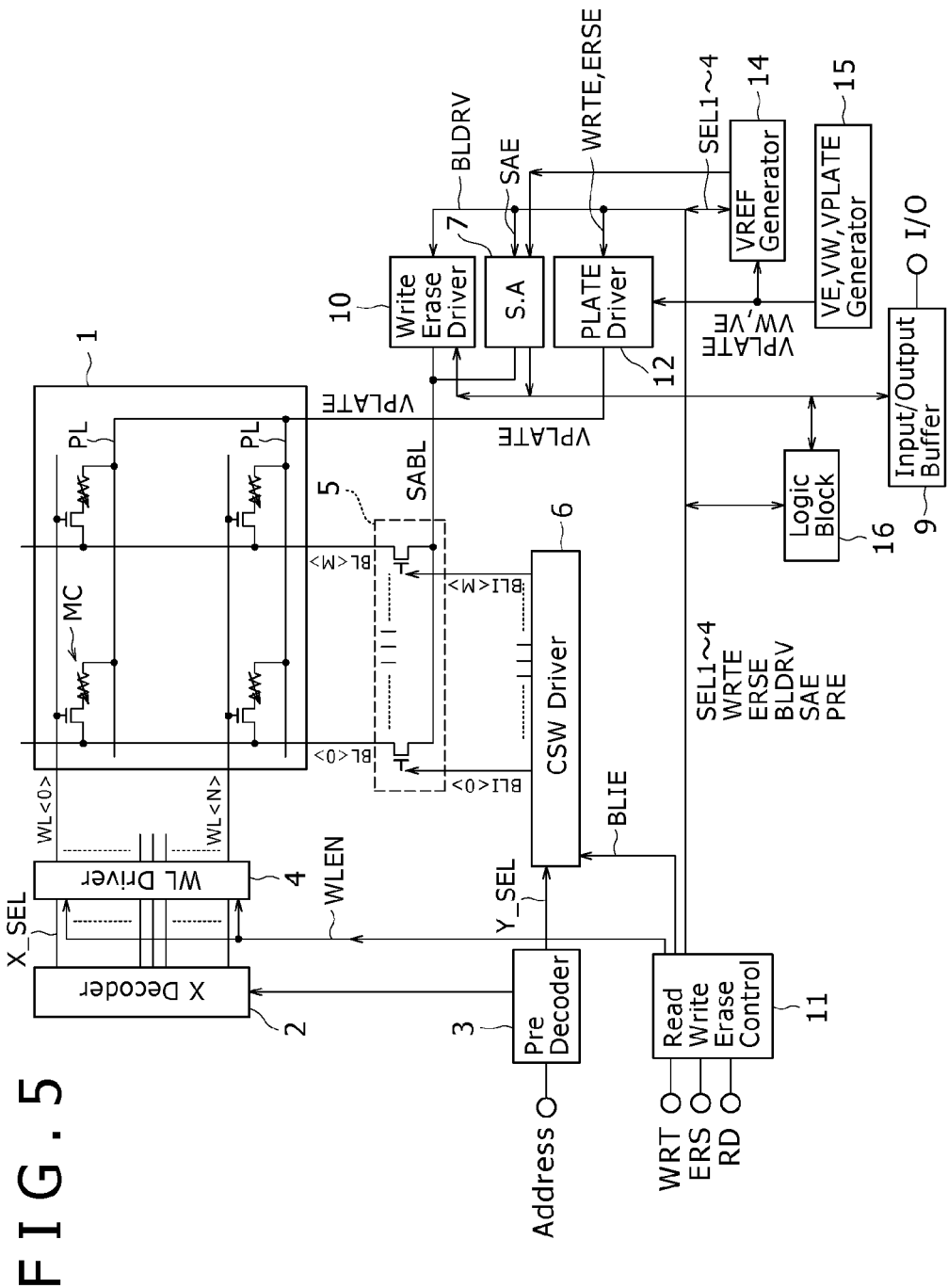
FIG. 5 is a block diagram showing the configuration of an IC chip of the variable-resistance memory device according to the first embodiment.

FIG. 5 is a block diagram showing the configuration of an IC chip of the variable-resistance memory device.

The variable-resistance memory device shown in the block diagram of FIG. 5 employs a memory array 1 and peripheral circuits of the memory array 1. The memory array 1 and the peripheral circuits are integrated to form the IC chip shown in the block diagram of FIG. 5. The memory array 1 is created as a matrix of memory cells MC shown in the diagrams of FIGS. 1A to 3B. The memory array 1 has rows and columns. Each of the rows has (M+1) memory cells MC laid out in the row direction whereas each of the columns has (N+1) memory cells MC laid out in the column direction. Each of reference symbols M and N denotes a relatively large integer. The concrete value of M and N can be set arbitrarily.

As described above, each of the rows of the memory array 1 has (M+1) memory cells MC laid out in the row direction. The gates of the access transistors AT each employed in one of the (M+1) memory cells MC are connected to the same word line WL oriented in the row direction. Thus, there are as many word lines WL as the rows. The number of word lines WL or the number of rows is (N+1). In the block diagram of FIG. 5, the (N+1) word lines WL are denoted by reference notations WL<0> to WL<N> respectively. The word lines WL<0> to WL<N> each oriented in the row direction are laid out in the column direction at intervals determined in advance.

On the other hand, each of the columns of the memory array 1 has (N+1) memory cells MC laid out in the column direction as described above. The drains of the access transistors AT each employed in one of the (N+1) memory cells MC are connected to the same bit line BL oriented in the column direction. Thus, there are as many bit lines BL as the columns. The number of bit lines BL or the number of columns is (M+1). In the block diagram of FIG. 5, the (M+1) bit lines BL are denoted by reference notations BL<0> to BL<M> respectively. The bit lines BL<0> to BL<M> each oriented in the column direction are laid out in the row direction at intervals determined in advance.

As described above, a specific one of the two ends of the variable-resistance cell resistor Rcell is connected to a plate line PL whereas the other one of the two ends of the variable-resistance cell resistor Rcell is connected to the source of the access transistor AT. The specific ends of the variable-resistance resistors Rcell on any particular one of the rows are connected to a common horizontal plate line PL associated with the particular row. Thus, the memory array 1 has as many horizontal plate lines PL as the rows. That is to say, the memory array 1 has (N+1) horizontal plate lines PL. The (N+1) horizontal plate lines PL each oriented in the row direction are laid out in the column direction at intervals determined in advance. Specific ends of the horizontal (N+1) plate lines PL are connected to each other by a common wire linked to a plate driver 12 which is provided at a location outside the memory array 1.

In addition, as an alternative, it is also possible to provide a configuration in which the specific ends of the variable-resistance resistors Rcell on any particular one of the columns are connected a common vertical plate line PL associated with the particular column. In this alternative configuration, the memory array 1 has as many plate vertical lines PL as the columns. That is to say, the memory array 1 has (M+1) vertical plate lines PL. The vertical (M+1) plate lines PL each oriented as a long wire in the column direction are laid out in the row direction at intervals determined in advance. Specific ends of the (M+1) vertical plate lines PL are connected to each other by a common wire linked to the plate driver 12 which is provided at a location outside the memory array 1.

As shown in the block diagram of FIG. 5, the peripheral circuits include an X-address decoder 2, a pre-decoder 3 also functioning as a Y-address decoder, a WL (word line) driver 4, a BLI (bit-line isolation) switch 5 and a CSW (column switch) driver 6. In addition, the peripheral circuits also employ an SA (sense amplifier) 7 provided for each of the columns and an I/O (input/output) buffer 9. On top of that, the peripheral circuits also have a write/erase driver 10, a control circuit 11 and the plate driver 12 cited above. Moreover, the peripheral circuits also include the reference-voltage generation/control circuit 14 also referred to as a VREF generator, the operation-voltage generation/control circuit 15 also referred to as a VE, VW, VPLATE generator and a logic block 16 for carrying out control operations such as the inhibit control.

The X-address decoder 2 is configured to include a plurality of X selectors 20 which each serve as the basic unit of the X-address decoder 2. The X-address decoder 2 is a circuit for decoding an X-address signal received from the pre-decoder 3 and for supplying an X select signal X_SEL selected on the basis of a result of the decoding process to the WL driver 4. Not shown in the block diagram of FIG. 5, the X selector 20 will be described later in detail by referring to a circuit diagram of FIG. 6.

The pre-decoder 3 is a circuit for splitting an input address signal into an X address signal and a Y address signal. The pre-decoder 3 supplies the X address signal to the X-address decoder 2. On the other hand, a Y-address decode section employed in the pre-decoder 3 decodes the Y address signal.

The Y-address decode section employed in the pre-decoder 3 is configured to include a plurality of Y selectors 30 which each serve as the basic unit of the Y-address decode section. The Y-address decode section employed in the pre-decoder 3 is a circuit for decoding a Y-address signal obtained as a result of splitting the input address signal and for supplying a Y select signal Y_SEL selected on the basis of a result of the decoding process to the CSW driver 6. Not shown in the block diagram of FIG. 5, the Y selector 30 will be described later in detail by referring to a circuit diagram of FIG. 7.

The WL driver 4 is configured to include a plurality of (N+1) WL-driver units 4A which are each provided for a word line WL. To put it detail, the output node of each of the (N+1) WL-driver units 4A is connected to one of the (N+1) word lines WL<0> to WL<N>. That is to say, each specific one of the (N+1) word lines WL<0> to WL<N> is connected to the output node of a WL-driver unit 4A that is provided for the specific word line WL. The X select signal X_SEL received from the X-address decoder 2 is used for selecting one of the (N+1) WL-driver units 4A. The selected one of the (N+1)

WL-driver units 4A applies a voltage determined in advance to a word line WL that is connected to the output node of the selected WL-driver unit 4A. Not shown in the block diagram of FIG. 5, the WL-driver unit 4A will be described later in detail by referring to a circuit diagram of FIG. 8.

The CSW driver 6 is configured to include a plurality of CSW-driver units 6A which each serve as the basic unit of the CSW driver 6. The CSW driver 6 is a circuit for generating a BLI (Bit-Line Isolation) signal BLI<M:0> in accordance with the Y select signal Y_SEL received from the pre-decoder 3 and a BLIE (Bit-Line Isolation Enable) signal received from the control circuit 11. The BL isolation signal BLI<M:0> generated by the CSW driver 6 is a signal supplied by the CSW driver 6 to the BLI switch 5 to serve as a signal for controlling the BLI switch 6. Not shown in the block diagram of FIG. 5, the CSW-driver unit 6A will be described later in detail by referring to a circuit diagram of FIG. 9.

The BLI switch 5 is a group of switches each configured to include only an NMOS transistor. As an alternative, the BLI switch 5 can also be a group of TGs (transmission gates) created from an NMOS transistor and a PMOS transistor by connecting the sources of the NMOS transistor and the PMOS transistor to each other and by connecting the drains of the NMOS transistor and the PMOS transistor to each other. Each of the switches (or the TGs) included in the BLI switch 5 is used for connecting a SABL (Sense-Amplifier Bit Line) to one of the bit lines BL. That is to say, the BLI switch 5 employs as many such switches (or TGs) as the bit lines BL. To put it more concretely, the BLI switch 5 employs a total of (M+1) switches (or TGs).

The BLI switch 5 is capable of controlling an operation to select and deselect one of the bit lines BL. To put it more concretely, in the case of the variable-resistance memory device shown in the block diagram of FIG. 5, an NMOS transistor employed in the BLI switch 5 is turned on by one of BL isolation signals BLI<0> to BLI<M> received from the CSW driver 6. The NMOS transistor put in the turned-on state connects the bit line BL wired to the NMOS transistor to a sense-amplifier bit line SABL which is wired to the sense node of the sense amplifier 7 and the write/erase driver 10.

The write/erase driver 10 is connected to the I/O buffer 9 which supplies input data coming from a source external to the variable-resistance memory device to the write/erase driver 10. In accordance with the input data, the write/erase driver 10 drives a bit line BL, which has been selected by the BLI switch 5, through the sense-amplifier bit line SABL and the NMOS transistor included in the BLI switch 5 as a transistor put in a turned-on state as described above.

The output node of the sense amplifier 7 is also connected to the I/O buffer 9. An electric-potential change occurring on a bit line BL selected by the BLI switch 5 is supplied to the sense amplifier 7 by way of the aforementioned NMOS transistor put in a turned-on state and the sense-amplifier bit line SABL. The sense amplifier 7 amplifies the electric-potential change and supplies the amplified electric-potential change to the I/O buffer 9.

As described earlier, the operation-voltage generation/control circuit 15 generates an erase BL voltage VE, a write BL voltage VW and a PL voltage VPLATE. The erase BL voltage VE and the write BL voltage VW which are generated by the operation-voltage generation/control circuit 15 are supplied to the reference-voltage generation/control circuit 14 and the write/erase driver 10. On the other hand, the PL voltage VPLATE also generated by the operation-voltage generation/control circuit 15 is supplied to the reference-voltage generation/control circuit 14 and the plate driver 12.

The reference-voltage generation/control circuit 14 is a circuit for generating a reference voltage VREF on the basis of the erase BL voltage VE, the write BL voltage VW and the PL voltage VPLATE which are received from the operation-voltage generation/control circuit 15. The reference-voltage generation/control circuit 14 supplies the reference voltage VREF to the reference node of the sense amplifier 7. Typical configurations of the reference-voltage generation/control circuit 14 and the operation-voltage generation/control circuit 15 will be described later by referring to a circuit diagram of FIG. 10.

The control circuit 11 operates on the basis of an input write enable signal WRT, an input erase enable signal ERS and a data read signal RD which are supplied to the control circuit 11 as shown in the block diagram of FIG. 5.

The control circuit 11 has the following six functions.
(1): A WL (word line) control function to supply a WL select enable signal WLEN to WL driver units 4A employed in the WL driver 4.
(2): A BLI (bit line isolation) control function to supply a BLI enable signal BLIE to CSW (column switch) driver units 6A employed in the CSW driver 6 which supplies BLI switch element select enable signals BLIE<0> to BLIR<m> to BLI switch elements employed in the BLI switch 5 in order to put one of the BLI switch elements in a turned-on state and the remaining BLI switch elements in a turned-off state.
(3): An operation-voltage generation control function to supply a write enable signal WRTE to the write/erase driver 10 in a data write operation or an erase enable signal ERSE to the write/erase driver 10 in a data erase operation to serve as a BL driving signal BLDRV in the embodiment.
(4): An operation-voltage generation control function to supply a write enable signal WRTE to the plate driver 12 in a data write operation or an erase enable signal ERSE to the plate driver 12 in a data erase operation if necessary to serve as a PL driving signal in the embodiment.
(5): An SA (sense amplifier) activation/deactivation control signal to supply an SA enable signal SAE to the sense amplifier 7 in a direct verify operation.
(6): An inhibit control function to carry out inhibit control by supplying an inhibit control signal to the logic block 16 in order to perform no more direct verify operations.

That is to say, the control circuit 11 outputs control signals including the WL select enable signal WLEN, the BLI enable signal BLIE, the BL driving signal BLDRV, the write enable signal WRTE, the erase enable signal ERSE, the SA enable signal SAE, the inhibit control signal supplied to the logic block 16, the pre-charge signal PRE and the divided-voltage select signals SEL1 to SEL4 as shown in the block diagram of FIG. 5. Each of the various control signals will be described later in detail.

The block diagram of FIG. 5 does not show other circuits such as a circuit for generating a variety of voltages from a power-supply voltage and a circuit for controlling generation of a clock signal.

Control-System Circuits

Next, the following description explains the X selector 20 serving as the basic unit of the X-address decoder 2 and the Y selector 30 serving as the basic unit of the Y-address decode section employed in the pre-decoder 3. Then, the following description explains the WL-driver unit 4A serving as the basic unit of the WL driver 4 and the CSW-driver unit 6A serving as the basic unit of the CSW driver 6.

Figure 6:
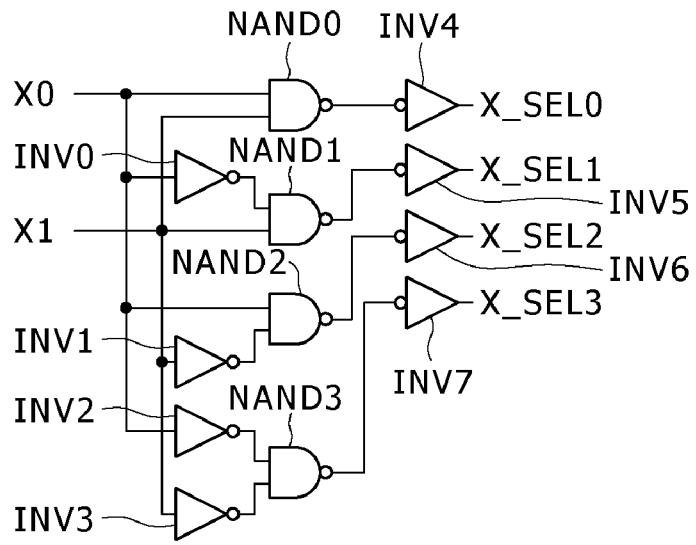
FIG. 6 is a circuit diagram showing a typical circuit of an X selector employed in the variable-resistance memory device.

FIG. 6 is a circuit diagram showing a typical circuit of the X selector 20.

The X selector 20 shown in the circuit diagram of FIG. 6 is configured to employ four inverters INV0 to INV3 provided at the front stage, four NAND circuits NAND0 to NAND3 provided at the middle stage and four other inverters INV4 to INV7 provided at the rear stage.

The X selector 20 receives X-address bits X0 and X1 from the pre-decoder 3, activating one of four X select signals X_SEL0 to X_SEL3 in accordance with a result of decoding the X-address bits X0 and X1. Typically, the X selector 20 activates any particular one of the four X select signals X_SEL0 to X_SEL3 by setting the particular X select signal X_SEL at a high level.

The X selector 20 shown in the circuit diagram of FIG. 6 is a typical 2-bit decoder. In accordance with the number of input X-address bits X to be decoded, however, the configuration of the X selector 20 shown in the circuit diagram of FIG. 6 can be expanded or the number of stages composing the configuration can be increased so as to keep up with 3 or more input X-address bits X.

Figure 7:
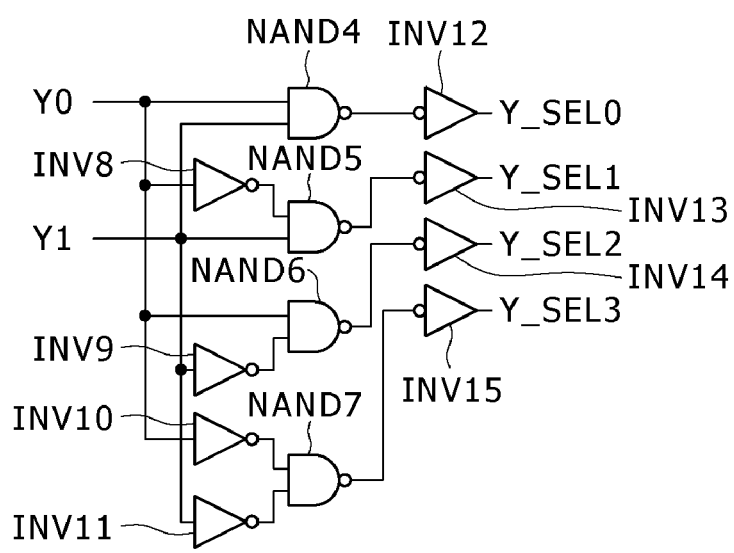
FIG. 7 is a circuit diagram showing a typical circuit of a Y selector employed in the variable-resistance memory device.

FIG. 7 is a circuit diagram showing a typical circuit of the Y selector 30.

The Y selector 30 shown in the circuit diagram of FIG. 7 is configured to employ four inverters INV8 to INV11 provided at the front stage, four NAND circuits NAND4 to NAND7 provided at the middle stage and four other inverters INV12 to INV15 provided at the rear stage.

The Y selector 30 receives Y-address bits Y0 and Y1, activating one of four Y select signals Y_SEL0 to Y_SEL3 in accordance with a result of decoding the Y-address bits Y0 and Y1. Typically, the Y selector 30 activates any particular one of the four Y select signals Y_SEL0 to Y_SEL3 by setting the particular Y select signal Y_SEL at a high level.

The Y selector 30 shown in the circuit diagram of FIG. 7 is a typical 2-bit decoder. In accordance with the number of input Y-address bits Y to be decoded, however, the configuration of the Y selector 30 shown in the circuit diagram of FIG. 7 can be expanded or the number of stages composing the configuration can be increased so as to keep up with 3 or more input Y-address bits Y.

Figure 8:
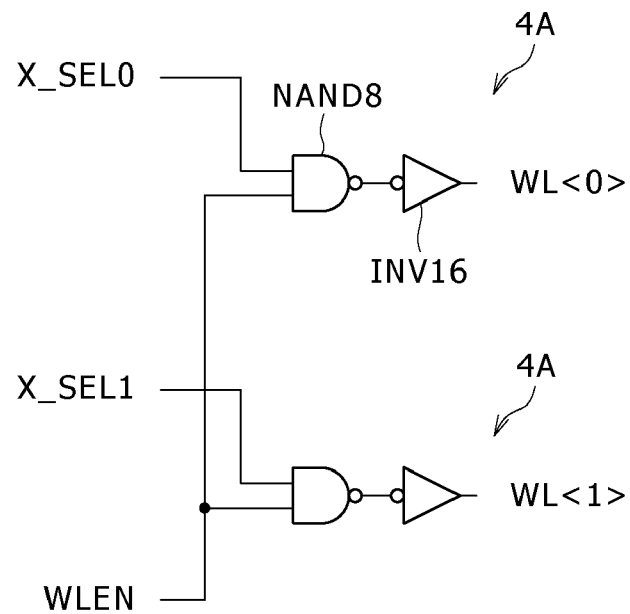
FIG. 8 is a circuit diagram showing two adjacent units of a WL driver employed in the variable-resistance memory device.

FIG. 8 is a circuit diagram showing two adjacent WL-driver units 4A of the WL driver 4.

The WL driver 4 employs as many WL-driver units 4A each shown in the circuit diagram of FIG. 8 as the rows of the memory-cell matrix or as memory cells MC provided on every column of the memory-cell matrix. As is obvious from the description given earlier, the number of rows composing the memory-cell matrix or the number of memory cells MC provided on every column of the memory-cell matrix is (N+1).

Each of the (N+1) WL-driver units 4A is driven to operate by an X select signal X_SEL selected (or activated) by the X selector 20 shown in the circuit diagram of FIG. 6. In the case of the configuration shown in the circuit diagram of FIG. 8, the two WL-driver units 4A are driven to operate by the X select signals X_SEL0 and X_SEL1 respectively. The WL-driver unit 4A driven by the X select signal X_SEL0 or X_SEL1 activates the word line WL<0> or WL<1> respectively.

As shown in the circuit diagram of FIG. 8, each WL-driver unit 4A is configured to employ a NAND circuit and an inverter. In the case of the configuration shown in the circuit diagram of FIG. 8, the upper WL-driver unit 4A is configured to employ a NAND circuit NAND8 and an inverter INV16.

One of the input nodes of the NAND circuit receives a WL select enable signal WLEN whereas the other input node of the NAND circuit receives the X select signal X_SEL0 or X_SEL1 selected (or activated) by the X selector 20 shown in the circuit diagram of FIG. 6. In the case of the upper WL-driver unit 4A included in the configuration shown in the circuit diagram of FIG. 8, the other input node of the NAND circuit NAND8 receives the X select signal X_SEL0. The output node of the NAND circuit NAND8 is connected to the input node of the inverter INV16. The output node of the inverter INV is connected to a word line WL<0> or WL<1>. In the case of the upper WL-driver unit 4A included in the configuration shown in the circuit diagram of FIG. 8, the output node of the inverter INV16 is connected to the word line WL<0>. A signal output by the inverter INV puts the word line WL connected to the inverter INV in an active or inactive state.

Figure 9:
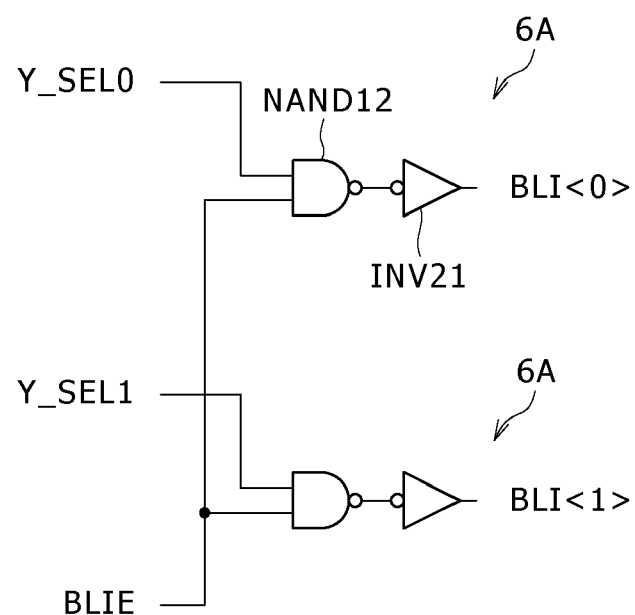
FIG. 9 is a circuit diagram showing two adjacent units of a CSW driver employed in the variable-resistance memory device.

FIG. 9 is a circuit diagram showing two adjacent CSW-driver units 6A of the CSW driver 6.

As shown in the circuit diagram of FIG. 9, each CSW-driver unit 6A is configured to employ a NAND circuit and an inverter. In the case of the configuration shown in the circuit diagram of FIG. 9, the upper CSW-driver unit 6A is configured to employ a NAND circuit NAND12 and an inverter INV21. The output node of the NAND circuit NAND12 is connected to input node of the inverter INV21.

One of the input nodes of the NAND circuit receives a BLI enable signal BLIE whereas the other input node of the NAND circuit receives the Y select signal Y_SEL0 or Y_SEL1 selected (or activated) by the Y selector 30 shown in the circuit diagram of FIG. 7. In the case of the upper CSW-driver unit 6A included in the configuration shown in the circuit diagram of FIG. 9, the other input node of the NAND circuit NAND12 receives the Y select signal Y_SEL0. If both the BLI enable signal BLIE and the Y select signal Y_SEL0 or Y_SEL1 are set at a high level representing an active state, the signal output by the NAND circuit NAND is put at the low level. Thus, the BL isolation signal BLI<0> or BLI<1> is set at the high level representing an active state in the case of this embodiment. In the case of the upper CSW-driver unit 6A included in the configuration shown in the circuit diagram of FIG. 9, if both the BLI enable signal BLIE and the Y select signal Y_SEL0 are set at a high level representing an active state, the signal output by the NAND circuit NAND12 is put at the low level. Thus, the BL isolation signal BLI<0> is set at the high level representing an active state in the case of this embodiment.

The lower CSW-driver unit 6A included in the configuration shown in the circuit diagram of FIG. 9 works in the same way as the upper CSW-driver unit 6A.

The BL isolation signals BLI<0>, BLI<1> and so on are denoted by reference symbols BLI<0> to BLI<M> in the block diagram of FIG. 5 and supplied to BLI switch elements employed in the BLI switch 5. To put it more concretely, each of the BL isolation signals BLI<0>, BLI<1> and so on is supplied the gate of an NMOS transistor employed in the BLI switch 5.

The control circuit 11 shown in the block diagram of FIG. 5 generates the WL select enable signal WLEN for the WL driver 4 shown in the circuit diagram of FIG. 8 and the BLI enable signal BLIE for the CSW driver 6 shown in the circuit diagram of FIG. 9, supplying the WL select enable signal WLEN and the BLI enable signal BLIE to the WL driver 4 and the CSW driver 6 respectively.

The control circuit 11 operates on the basis of the input write enable signal WRT, the input erase enable signal ERS and the data read signal RD, which are supplied to the control circuit 11, generating a variety of control signals in addition to the WL select enable signal WLEN and the BLI enable signal BLIE as described earlier. As described earlier, the control signals other than the WL select enable signal WLEN and the BLI enable signal BLIE include the BL driving signal BLDRV, the write enable signal WRTE, the erase enable signal ERSE, the SA enable signal SAE for controlling the sense amplifier 7, the inhibit control signal supplied to the logic block 16, the pre-charge signal PRE and the select signals SEL1 to SEL4. In order to better understand the explanation, the reader is suggested to refer to the block diagram of FIG. 5.

Details of Read-System Circuit

Figure 10:
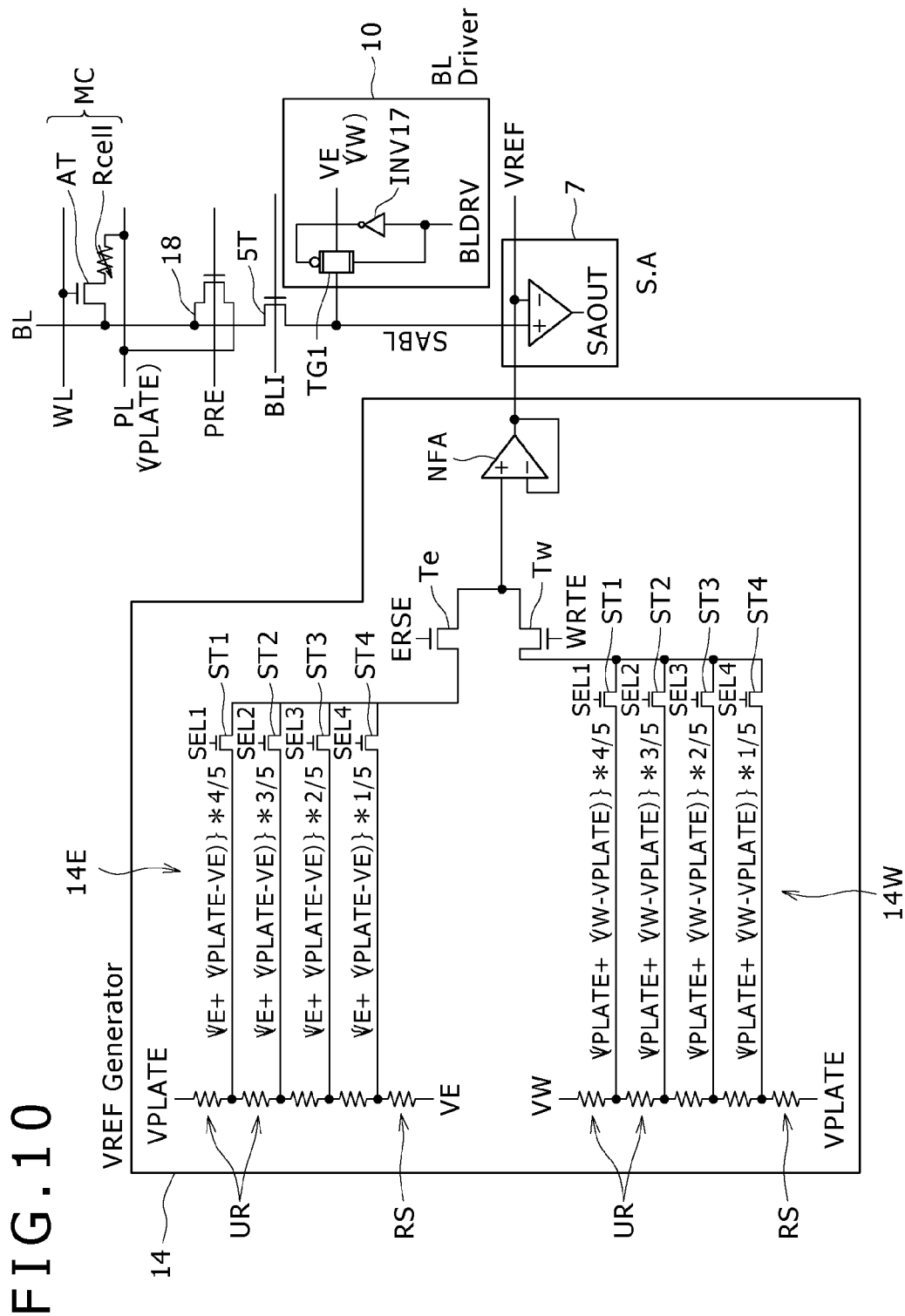
FIG. 10 is a circuit diagram showing details of mainly a read-system circuit connected to a memory cell employed in the variable-resistance memory device according to the first embodiment.

FIG. 10 is a circuit diagram showing details of mainly a read-system circuit connected to a memory cell MC employed in the variable-resistance memory device according to the first embodiment.

As described earlier, the variable-resistance memory device according to the embodiment employs a memory array 1 and peripheral circuits of the memory array 1. The memory array 1 is created as a matrix of memory cells MC shown in the diagrams of FIGS. 1A to 3B. The peripheral circuits serve as a driving circuit for driving the memory array 1. For the sake of simplicity of the figure, the circuit diagram of FIG. 10 shows a read-control circuit for only one memory-cell column including only one of memory cells MC connected to a bit line BL. In actuality, however, the variable-resistance memory device according to the embodiment has a number of memory-cell columns and each of the columns includes a number of memory cells MC connected to a common bit line BL shared by the memory cells MC. In the following description, the memory-cell column is also referred to simply as a memory column.

The read-system circuit includes the aforementioned peripheral circuits used in a direct verify operation carried out on memory cells connected to one bit line BL. In the typical read-system circuit shown in the circuit diagram of FIG. 10, the peripheral circuits includes the sense amplifier 7, the write/erase driver 10 and the reference-voltage generation/control circuit 14. In the circuit diagram of FIG. 10, the write/erase driver 10 functioning as a section employed in the operation-voltage generation/control circuit 15 is referred to as a BL driver.

The sense amplifier 7, the write/erase driver 10 and the reference-voltage generation/control circuit 14 can be provided for every memory array 1 shown in the block diagram of FIG. 5. As an alternative, the sense amplifier 7, the write/erase driver 10 and the reference-voltage generation/control circuit 14 can also be provided for every predetermined plurality of aforementioned memory columns or every memory sub-array.

The reference-voltage generation/control circuit 14 is a circuit for generating a reference voltage to be compared by the sense amplifier 7. The sense amplifier 7 and the write/erase driver 10 are connected to a sense-amplifier bit line SABL which is linked to the bit line BL by the BLI switch 5 shown in the block diagram of FIG. 5. As shown in detail in the circuit diagram of FIG. 10, the sense-amplifier bit line SABL is linked to the bit line BL by a BLI transistor 5T which serves as one of the BLI switch elements employed in the BLI switch 5 shown in the block diagram of FIG. 5.

The sense amplifier 7 is a kind of amplifier which has a sense node denoted by reference symbol "+" and a reference node denoted by reference symbol "−." In an enabled state set by the SA enable signal SAE generated by the control circuit 11, the sense amplifier 7 takes the reference voltage VREF, which is supplied by the reference-voltage generation/control circuit 14 to the reference node "−," as a comparison reference and amplifies a BL voltage appearing on the sense node "+." The BL voltage is a voltage supplied from the bit line BL to the sense node "+" through the BLI switch 5 and the sense-amplifier bit line SABL. To put it in detail, in the enabled state, the sense amplifier 7 detects a magnitude relation between the reference voltage VREF supplied to the reference node "−" and the BL voltage appearing on the sense node "+." Then, by sustaining the magnitude relation between the reference voltage VREF and the BL voltage as it is, the sense amplifier 7 amplifies the difference between the reference voltage VREF and the BL voltage to a voltage having a magnitude equal to the level of a voltage generated by a power supply. The sense amplifier 7 outputs the amplified voltage to the I/O buffer 9. The amplified voltage output by the sense amplifier 7 is referred to as an SA output signal SAOUT.

The write/erase driver 10 also referred to as a BL driver is configured to employ an inverter INV17 and a transfer gate circuit TG1. The transfer gate circuit TG1 is connected between an input node of the write/erase driver 10 and the sense-amplifier bit line SABL. The input node of the write/erase driver 10 is a node for receiving an erase BL voltage VE or a write BL voltage VW from the operation-voltage generation/control circuit 15 which is shown in the block diagram of FIG. 5. The inverter INV17 is connected between the gates of an NMOS transistor and a PMOS transistor which form the transfer gate circuit TG1. The input to the inverter INV17 is the BL drive signal BLDRV generated by the control circuit 11 which is also shown in the block diagram of FIG. 5.

The reference-voltage generation/control circuit 14 employed in the typical read-system circuit shown in the circuit diagram of FIG. 10 includes two voltage generation sections 14E and 14W which each include a potentiometer for generating an output voltage by dividing an input voltage on the basis of resistances. The erase reference-voltage generation section 14E and the write reference-voltage generation section 14W are provided for the data erase operation and the data write operation respectively. The reference-voltage generation/control circuit 14 also has an erase transistor Te and a negative feedback amplifier NFA. Controlled by the erase enable signal ERSE, the erase transistor Te is a transistor serving as a switch for passing on the output voltage generated by the erase reference-voltage generation section 14E to the negative feedback amplifier NFA for stabilizing the output voltage which serves as the reference voltage VREF. By the same token, the reference-voltage generation/control circuit 14 also has a write transistor Tw and shares the negative feedback amplifier NFA with erase transistor Te. Controlled by the write enable signal WRTE, the write transistor Tw is a transistor serving as a switch for passing on the output voltage generated by the write reference-voltage generation section 14W to the negative feedback amplifier NFA for stabilizing the output voltage.

The potentiometer employed in the erase reference-voltage generation section 14E has a resistor string RS including typically five unit resistors UR which are connected to each other in series. A connection point between any two adjacent unit resistors UR is referred to as an inter-resistor tap or an inter-resistor node. In the case of the potentiometer having such a configuration, the erase reference-voltage generation section 14E also includes four select transistors ST1 to ST4 which are each connected to one of the four inter-resistor taps. The four select transistors ST1 to ST4 are controlled by the divided-voltage select signals SEL1 to SEL4 respectively. The select signals SEL1 to SEL4 are generated by the control circuit 11 shown in the block diagram of FIG. 5 as described earlier.

The four select transistors ST1 to ST4 and the erase transistor Te are a typical implementation of a divided-voltage select circuit provided by an embodiment of the present invention.

A specific one of the two ends of the resistor string RS employed in the erase reference-voltage generation section 14E receives the PL voltage VPLATE generated by the operation-voltage generation/control circuit 15 which is shown in the block diagram of FIG. 5. The other one of the two ends of the resistor string RS employed in the erase reference-voltage generation section 14E receives the erase BL voltage VE also generated by the operation-voltage generation/control circuit 15. A divided voltage appears at each of the inter-resistor taps of the resistor string RS as a result of dividing the difference between the PL voltage VPLATE and the erase BL voltage VE.

On the other hand, a specific one of the two ends of the resistor string RS employed in the write reference-voltage generation section 14W receives the write BL voltage VW generated by the operation-voltage generation/control circuit 15 which is shown in the block diagram of FIG. 5. The other one of the two ends of the resistor string RS employed in the write reference-voltage generation section 14W receives the PL voltage VPLATE also generated by the operation-voltage generation/control circuit 15. A divided voltage appears at each of the inter-resistor taps of the resistor string RS as a result of dividing the difference between the write BL voltage VW and the PL voltage VPLATE.

The control circuit 11 shown in the block diagram of FIG. 5 activates an erase enable signal ERSE in order to put the erase transistor Te in a turned-on state. With the erase transistor Te put in a turned-on state, the erase transistor Te passes on a divided voltage, which is output by one of the four select transistors ST1 to ST4 of the erase reference-voltage generation section 14E from the resistor string RS in accordance with the divided-voltage select signals SEL1 to SEL4, to the negative feedback amplifier NFA.

By the same token, the control circuit 11 shown in the block diagram of FIG. 5 activates a write enable signal WRTE in order to put the write transistor Tw in a turned-on state. With the write transistor Tw put in a turned-on state, the write transistor Tw passes on a divided voltage, which is output by one of the four select transistors ST1 to ST4 of the write reference-voltage generation section 14W from the resistor string RS in accordance with the divided-voltage select signals SEL1 to SEL4, to the negative feedback amplifier NFA.

The divided voltage passed on by the erase transistor Te or the write transistor Tw is supplied to the non-inverting input node "+" of the negative feedback amplifier NFA. The inverting input node "−" of the negative feedback amplifier NFA is wired to the output node of the negative feedback amplifier NFA.

The signal output by the negative feedback amplifier NFA is the reference voltage VREF which is supplied to the reference node "−" of the sense amplifier 7.

As described above, the reference-voltage generation/control circuit 14 including a series circuit of unit resistors UR serving as a potentiometer for dividing the erase BL voltage VE or the write BL voltage VW generates a divided voltage with the PL voltage VPLATE taken as a reference voltage. The divided voltage changing with variations in erase BL voltage VE or write BL voltage VW is then output from a selected one of the select transistors ST1 to ST4. Subsequently, in the reference-voltage generation/control circuit 14, the divided voltage output by the selected one of the select transistors ST1 to ST4 is supplied to the negative feedback amplifier NFA for stabilizing the divided voltage and finally outputting the stabilized voltage to the reference node "−" of the sense amplifier 7 as the reference voltage VREF.

As a result, for the data erase operation, the relation in magnitude between the reference voltage VREF generated by the reference-voltage generation/control circuit 14 and the PL voltage VPLATE is the same as the relation in magnitude between the erase BL voltage VE and the PL voltage VPLATE. For the data write operation, on the other hand, the relation in magnitude between the reference voltage VREF and the PL voltage VPLATE is the same as the relation in magnitude between the write BL voltage VW and the PL voltage VPLATE. In addition, the magnitude of the reference voltage VREF relative to the PL voltage VPLATE also changes in accordance with the magnitude of the erase BL voltage VE or the write BL voltage VW relative to the PL voltage VPLATE.

It is to be noted that, in a typical modified version of the embodiment to be described later, instead of changing the BL voltage generated by the write/erase driver 10, the PL voltage VPLATE is changed with the BL voltage sustained at a constant level. In order to generate a variable PL voltage VPLATE, it is necessary to design the plate driver 12 shown in the block diagram of FIG. 5 into a configuration which is all but identical with the configuration of the write/erase driver 10 shown in the circuit diagram of FIG. 10. That is to say, the plate driver 12 employed in the typical modified version of the embodiment supplies the erase BL voltage VE in the data erase operation or the write BL voltage VW in the data write operation to the plate line PL. In the case of the typical modified version of the embodiment, the electric potential appearing on the bit line BL is held at a constant level or, as an alternative, the electric potential appearing on the bit line BL is also changed on the basis of a difference in electric potential between the erase BL voltage VE and the write BL voltage VW, which are applied to the plate line PL, so as to generate an erase pulse having a desired pulse height and a write pulse also having a desired pulse height.

In the case of the typical modified version of the embodiment, the relation in magnitude between the reference voltage VREF generated by the reference-voltage generation/control circuit 14 and the constant voltage applied to the BL line is the same as the relation in magnitude between the variable PL voltage VPLATE applied to the plate line PL and the constant voltage. In addition, with the constant voltage taken as a reference, the magnitude of the reference voltage VREF also changes in accordance with the magnitude of the variable PL voltage VPLATE. As described above, the variable PL voltage VPLATE is equal to the erase BL voltage VE in the data erase operation (or the write BL voltage VW in the data write operation) for the embodiment.

In the typical configuration of the read-control circuit shown in circuit diagram of FIG. 10, the operation-voltage generation/control circuit 15 shown in the block diagram of FIG. 5 supplies the variable erase BL voltage VE or the variable write BL voltage VW to the bit line BL by way of the write/erase driver 10. In this case, the operation-voltage generation/control circuit 15 supplies a typically fixed PL voltage VPLATE to the reference-voltage generation/control circuit 14 and the plate driver 12.

It is to be noted that, as shown in circuit diagram of FIG. 10, a pre-charge transistor 18 is provided between the bit line BL and the plate line PL to serve as a transistor to be put in a turned-on state by setting a pre-charge signal PRE generated by the control circuit 11 shown in the block diagram of FIG. 5 in an active state.

In this embodiment, as described above, the PL voltage VPLATE appearing on the plate line PL is controlled to stay at a fixed level during the data write operation, the data erase operation and the direct verify operation. At a non-operation time, however, the PL voltage VPLATE is set at a high level in order to electrically pre-charge the bit line BL through the pre-charge transistor 18. It is to be noted, however, that the mechanism for electrically pre-charging the bit line BL can be modified in a variety of ways by, for example, providing a separate electrical pre-charge line.

Direct Verify Erase Sequence

A direct verify erase sequence is a sequence of data erase operations and direct verify erase operations which are each carried out right after application of an erase pulse for carrying out one of the data erase operations. FIGS. 11A to 11F are a timing diagram showing a plurality of waveforms each representing a timing chart of a signal controlled or voltage changes on a line in two consecutive direct verify erase operations which are carried out in accordance with the first embodiment. FIG. 12 is an explanatory diagram showing a concept of a data write operation which is executed by consecutively carrying out the direct verify erase operation three times under control executed in accordance with the timing diagrams shown in FIGS. 11A to 11I. The conceptual diagram of FIG. 12 will be described in more detail later.

Figure 11:
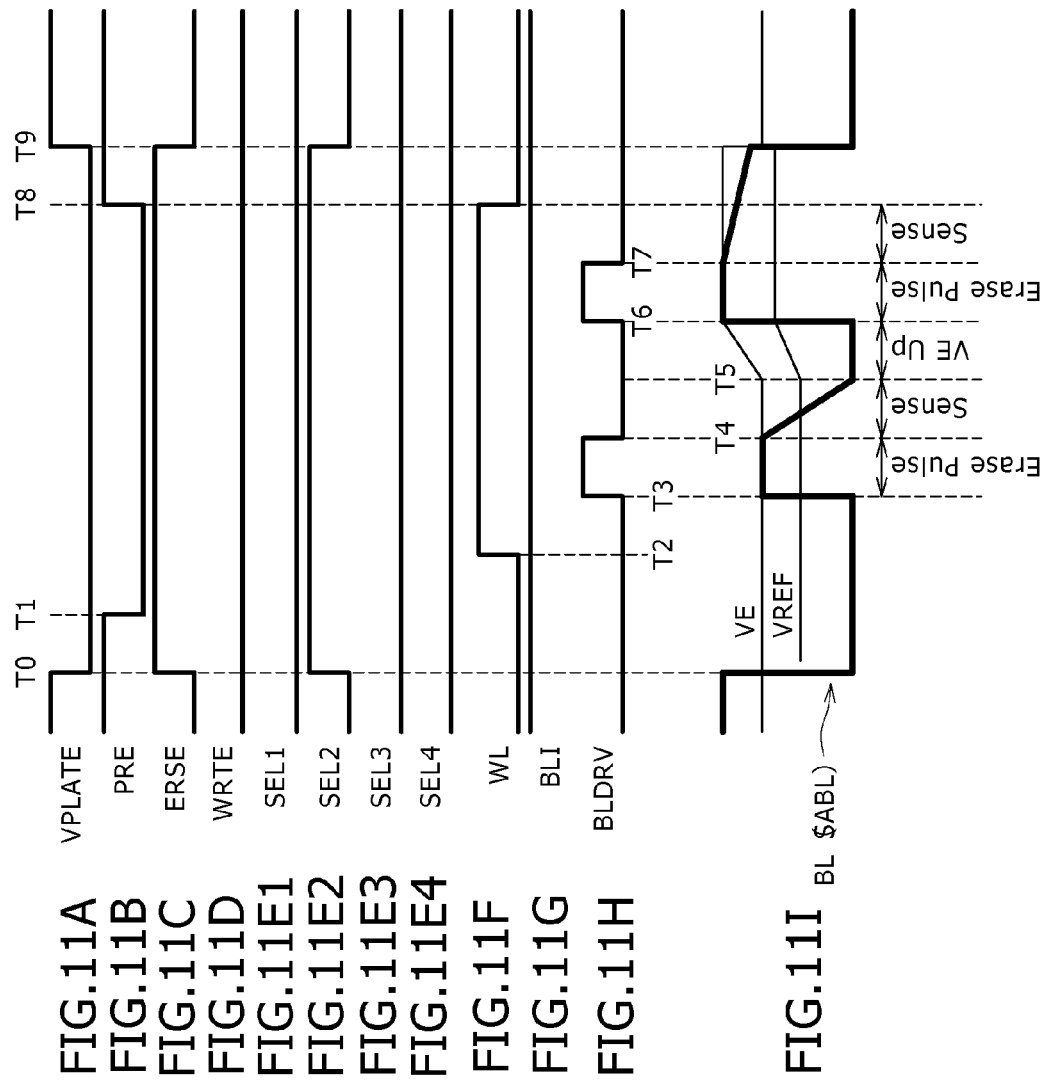
FIGS. 11A to 11I are a plurality of diagrams showing the same plurality of waveforms each representing a timing chart of a signal used in a sequence of data erase operations each immediately followed by a direct verify erase operation carried out in accordance with the first embodiment.
Figure 12:
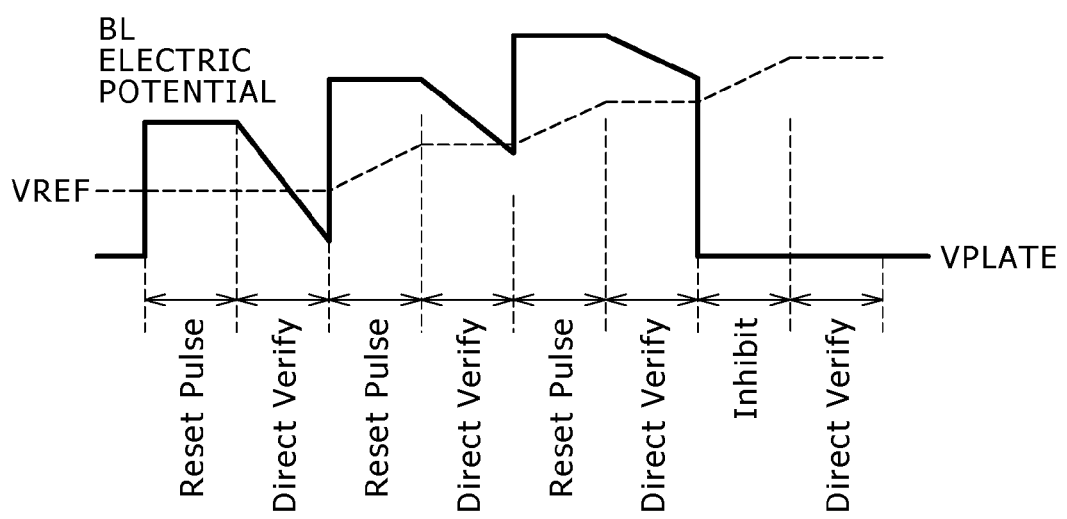
FIG. 12 is an explanatory diagram showing a concept of a data update operation which is executed by consecutively carrying out a direct verify operations three times.

To be more specific, FIG. 11A is a waveform diagram showing the timing chart of the PL voltage VPLATE. FIG. 11B is a waveform diagram showing the timing chart of the pre-charge signal PRE. FIG. 11C is a waveform diagram showing the timing chart of the erase enable signal ERSE. FIG. 11D is a waveform diagram showing the timing chart of the write enable signal WRTE. FIG. 11E1 is a waveform diagram showing the timing chart of the divided-voltage select signal SEL1. FIG. 11E2 is a waveform diagram showing the timing chart of the divided-voltage select signal SEL2. FIG. 11E3 is a waveform diagram showing the timing chart of the divided-voltage select signal SEL3. FIG. 11E4 is a waveform diagram showing the timing chart of the divided-voltage select signal SEL4. FIG. 11F is a waveform diagram showing the timing chart of the WL electric potential appearing on the word line WL. FIG. 11G is a waveform diagram showing the timing chart of the BL isolation signal BLI. FIG. 11H is a waveform diagram showing the timing chart of the BL drive signal BLDRV. FIG. 11I is a waveform diagram showing the timing chart of the BL electric potential appearing on the bit line BL and the sense-amplifier bit line SABL, the timing chart of the erase BL voltage VE and the timing chart of the reference voltage VREF.

It is to be noted that, by superposition on changes in BL electric potential, the waveform diagram of FIG. 11I also shows variations of the erase BL voltage VE generated and controlled by the operation-voltage generation/control circuit 15 shown in the block diagram of FIG. 5 as well as changes of the reference voltage VREF generated and controlled by the reference-voltage generation/control circuit 14, which includes a potentiometer based on resistors as shown in the circuit diagram of FIG. 10, in accordance with the variations of the erase BL voltage VE.

FIGS. 11A to 11I are timing diagrams for a typical data erase operation including a no-go first direct verify erase operation followed by a second direct verify erase operation which meets a criterion for success by virtue of a step-up process of increasing the erase BL voltage VE to be applied prior to the second direct verify erase operation. A no-go direct verify operation is a direct verify operation producing a result which indicates that the data update operation immediately preceding the direct verify operation was not successful. In addition, in the typical data erase operation shown in the timing diagrams of FIGS. 11A to 11I, the divided-voltage select signal SEL2 is chosen from the four divided-voltage select signals SEL1 to SEL4. It is to be noted, however, that a divided-voltage select signal other than the divided-voltage select signal SEL2 can also be chosen from the four divided-voltage select signals SEL1 to SEL4.

In a standby state prior to a time T0, each of the PL voltage VPLATE, the pre-charge signal PRE and the BL isolation signal BLI is sustained at an H (high) level as shown in the waveform diagrams of FIGS. 11A, 11B and 11G respectively. With the pre-charge signal PRE set at an H level, the pre-charge transistor 18 is sustained in a turn-on state and, with the BL isolation signal BLI sustained at an H level, the BLI transistor 5T is sustained in a turn-on state. With the pre-charge transistor 18 set in the turned-on state, the PL voltage VPLATE set at the H level is electrically pre-charged to the bit line BL. With the BLI transistor 5T set in the turned-on state, the bit line BL is connected to the sense-amplifier bit line SABL. Thus, the sense-amplifier bit line SABL is also electrically pre-charged by the PL voltage VPLATE set at the H level as the bit line BL is.

The data erase operation is started at the time T0 when the PL voltage VPLATE is changed from the H level to an L (low) level as shown in the waveform diagram of FIG. 11A whereas the erase enable signal ERSE is changed from the L level to the H level as shown in the waveform diagram of FIG. 11C. When the PL voltage VPLATE is changed from the H level to the L level, the BL electric potential appearing on the bit line BL and the sense-amplifier bit line SABL is also changed from the H level to the L level as shown in the waveform diagram of FIG. 11I.

At the same time, that is, at the time T0, the divided-voltage select signal SEL2 is changed from the L level to the H level as shown in the waveform diagram of FIG. 11E2 in order to put the select transistor ST2 shown in the circuit diagram of FIG. 10 in a turned-on state whereas the erase enable signal ERSE is changed from the L level to the H level as shown in the waveform diagram of FIG. 11C as described above in order to put the erase transistor Te shown in the circuit diagram of FIG. 10 in a turned-on state. With each of the select transistor ST2 and the erase transistor Te put in a turned-on state, the reference voltage VREF is set at a desired divided-voltage level which is equal to $\{VE+(VPLATE-VE)*(3/5)\}$ in this case. At that time, for an unselected bit line BL not shown particularly in the timing diagrams of FIGS. 11A to 11I, the BL isolation signal BLI is sustained at the L level. Thus, the unselected sense-amplifier bit line SABL is excluded from subjects of the data erase operation to be carried out thereafter. Since FIG. 11G is a diagram showing the waveform of the BL isolation signal BLI of a selected bit line BL, however, the BL isolation signal BLI is sustained hereafter at the H level as it is.

Then, at a time T1, the pre-charge signal PRE is changed from the H level to the L level as shown in the waveform diagram of FIG. 11B in order to put the pre-charge transistor 18 shown in the circuit diagram of FIG. 10 in a turned-off state. With the pre-charge transistor 18 put in the turned-off state, a pre-charge path between the bit line BL and the plate line PL is cut off so that the bit line BL and the plate line PL are disconnected from each other. Then, at a time T2, the electric potential appearing on the word line WL is changed from the L level to the H level as shown in the waveform diagram of FIG. 11F in order to put the access transistor AT in a turned-on state. With the access transistor AT put in the turned-on state, a current path of the memory cell MC is created between the bit line BL and the plate line PL to replace the pre-charge path. The current path connects the bit line BL and the plate line PL to each other through the access transistor AT and the variable-resistance cell resistor Rcell which are employed in the memory cell MC.

Then, during a period between times T3 and T4, the control circuit 11 is sustaining the BL drive signal BLDRV at the H level as shown in the waveform diagram of FIG. 11H in order to apply a positive pulse to the write/erase driver 10 shown in the circuit diagram of FIG. 10. This positive pulse keeps the write/erase driver 10 in a turned-on state. With the write/erase driver 10 put in the turned-on state, the erase BL voltage VE generated by the operation-voltage generation/control circuit 15 shown in the block diagram of FIG. 5 is being passed on to the sense-amplifier bit line SABL by way of the write/erase driver 10. As a result, during the period between the times T3 and T4, the sense-amplifier bit line SABL and, thus, the bit line BL are being sustained at the level of the erase BL voltage VE as shown in the waveform diagram of FIG. 11I.

With the erase BL voltage VE being passed on to the sense-amplifier bit line SABL by way of the write/erase driver 10, an erase pulse is applied to the memory cell MC. The magnitude of the erase pulse is equal to the difference in electric potential between the PL voltage VPLATE and the erase BL voltage VE. The erase pulse is being applied to the memory cell MC only during the short period between the times T3 and T4. As a result, an erase current Ie is flowing through the memory cell MC and increases the resistance of the variable-resistance cell resistor Rcell of the memory cell MC as shown in the diagram of FIG. 3B.

At the time T4, the positive pulse of the BL drive signal BLDRV is terminated so that the write/erase driver 10 stops the driving operation to supply the erase BL voltage VE to the sense-amplifier bit line SABL. When the write/erase driver 10 stops the driving operation to supply the erase BL voltage VE to the sense-amplifier bit line SABL, the sense-amplifier bit line SABL and, thus, the bit line BL are put in a floating state. That is to say, when the write/erase driver 10 stops the driving operation to supply the erase BL voltage VE to the sense-amplifier bit line SABL, the memory cell MC makes a transition from a driving state of forcibly supplying the erase BL voltage VE to the sense-amplifier bit line SABL to an electrical discharge state of allowing the bit line BL to self-discharge residual electric charge remaining on the bit line BL to the plate line PL through the memory cell MC. The direct verify erase operation cited before is a sense (or read) operation which is carried out to determine whether or not the resistance of the variable-resistance cell resistor Rcell employed in the memory cell MC has been increased sufficiently, that is, whether or not an attempt to erase data from the memory cell MC has been adequate. The adequacy of this attempt depends on how much the residual electric charge remaining on the bit line BL is discharged to the plate line PL through the memory cell MC right after the application of the erase pulse to the memory cell MC, that is, how much an electric potential appearing on the sense-amplifier bit line SABL is decreased.

The direct verify erase operation is started at the time T4 and terminated at a time T5. In the direct verify erase operation, residual electric charge remaining on the bit line BL is discharged to the plate line PL through the memory cell MC. Therefore, the electric potential appearing on the bit line BL (and, thus, the sense-amplifier bit line SABL) starts to decrease as shown in the waveform diagram of FIG. 11I. At a time slightly leading ahead of the time T5, that is, after the electrical discharge process to discharge residual electric charge remaining on the bit line BL to the plate line PL through the memory cell MC for a time period determined in advance, the SA enable signal SAE not shown particularly in the timing diagrams of FIGS. 11A to 11I is put in an active state. With the SA enable signal SAE put in an active state, the sense amplifier 7 amplifies an electric potential appearing on the sense-amplifier bit line SABL by taking the electric potential of the reference voltage VREF as a reference in the so-called amplification operation. As a result of the amplification operation, the sense amplifier 7 generates an SA output signal SAOUT, outputting the SA output signal SAOUT to internal recipients such as an internal CPU (Central Processing Unit) and external recipients such as an external CPU by way of the I/O buffer 9.

In this first direct verify erase operation, the residual electric charge remaining on the bit line BL is discharged to the plate line PL through the memory cell MC so that the electric potential appearing on the sense-amplifier bit line SABL is reduced to a level below the reference voltage VREF at the time the SA enable signal SAE is put in an active state prior to the time T5. In this case, the SA output signal SAOUT generated by the sense amplifier 7 indicates that the application of the first erase pulse to the memory cell MC prior to the first direct verify erase operation has been ended in failure in erasing data from the memory cell MC, that is, the operation to increase the resistance of the variable-resistance cell resistor Rcell serving as the data storage element of the memory cell MC has been inadequate.

With the SA output signal SAOUT from the sense amplifier 7 indicating that the first direct verify erase operation has been a no-go operation, the operation-voltage generation/control circuit 15 starts a step-up period to increase the erase BL voltage VE at the time T5 in order to raise the magnitude of an erase pulse to be applied next to the memory cell MC. When the operation-voltage generation/control circuit 15 increases the erase BL voltage VE, the reference-voltage generation/control circuit 14 including a potentiometer also raises the reference voltage VREF since the potentiometer is driven by the difference between the erase BL voltage VE and the constant PL voltage VPLATE as shown in the circuit diagram of FIG. 10. As a result, the reference voltage VREF automatically follows the erase BL voltage VE as shown in the waveform diagram of FIG. 11I.

The step-up period is terminated at a time T6. At about the same time as the time T6, the second positive pulse of the BL drive signal BLDRV is applied to the write/erase driver 10 as shown in the waveform diagram of FIG. 11H. As a result, the second erase pulse is applied to the memory cell MC during the short period between the times T6 and T7 in the same way as the first erase pulse applied to the memory cell MC during the short period between the times T3 and T4 except that the magnitude of the second erase pulse is larger than that of the first erase pulse.

Then, in the same way as the first direct verify erase operation started at the time T4 and ended at the T5, the second direct verify erase operation is started at the time T7 and terminated at a time T8. At the time T7, the second positive pulse of the BL drive signal BLDRV is terminated so that the write/erase driver 10 stops the driving operation to supply the erase BL voltage VE to the sense-amplifier bit line SABL. Thus, the sense-amplifier bit line SABL and the bit line BL are put in a floating state. That is to say, when the write/erase driver 10 stops the driving operation to supply the erase BL voltage VE to the sense-amplifier bit line SABL, the memory cell MC makes a transition from a driving state of forcibly supplying the erase BL voltage VE to the sense-amplifier bit line SABL to an electrical discharge state of allowing the bit line BL to self-discharge residual electric charge remaining on the bit line BL to the plate line PL through the memory cell MC.

At a time slightly leading ahead of the time T8, that is, after the electrical discharge process to discharge residual electric charge remaining on the bit line BL to the plate line PL through the memory cell MC for a time period determined in advance, the SA enable signal SAE is put in an active state in order to enable the sense amplifier 7. In this second direct verify erase operation, the magnitude of the second erase pulse is larger than that of the first erase pulse. Thus, the residual electric charge remaining on the bit line BL is discharged to the plate line PL through the memory cell MC so that the electric potential appearing on the sense-amplifier bit line SABL is reduced to a level still above the reference voltage VREF at the time the SA enable signal SAE is put in an active state prior to the time T8. In this case, the SA output signal SAOUT generated by the sense amplifier 7 indicates that the application of the second erase pulse to the memory cell MC prior to the second direct verify operation has been successful in erasing data from the memory cell MC, that is, the data erase operation carried out so far on the memory cell MC has been adequate, meeting a criterion for success.

As described above, the sense amplifier 7 outputs the SA output signal SAOUT used as information on the erase pulse to internal recipients such as an internal CPU and external recipients such as an external CPU by way of the I/O buffer 9. Such a CPU informs the operation-voltage generation/control circuit 15 not start a step-up period to increase the erase BL voltage VE at the time T8. Instead of starting a step-up period at the time T8, the pre-charge signal PRE is initialized by changing the pre-charge signal PRE from the L level to the H level as shown in the waveform diagram of FIG. 11B whereas the electric potential appearing on the word line WL is changed from the H level to the L level as shown in the waveform diagram of FIG. 11F. Then, at a time T9, the PL voltage VPLATE is changed from the L level to the H level as shown in the waveform diagram of FIG. 11A, the erase enable signal ERSE is changed from the H level to the L level as shown in the waveform diagram of FIG. 11C and the divided-voltage select signal SEL2 is changed from the H level to the L level as shown in the waveform diagram of FIG. 11E2. Thus, the data erase operation is terminated at the time T9.

FIG. 12 is an explanatory diagram showing a concept of a data update operation which is executed three times to be followed respectively by three consecutive direct verify operations which are carried out as explained above. In the conceptual diagram of FIG. 12, the reference voltage VREF is raised to follow increases of the erase BL voltage VE which is not shown in the figure. This is because, as described before, the reference-voltage generation/control circuit 14 including a potentiometer raises the reference voltage VREF since the potentiometer is driven by the difference between the erase BL voltage VE and the constant PL voltage VPLATE as shown in the circuit diagram of FIG. 10. As a result, the reference voltage VREF is controlled to be equal to a fraction of the difference between the erase BL voltage VE and the PL voltage VPLATE.

Direct Verify Write Sequence

Figure 13:
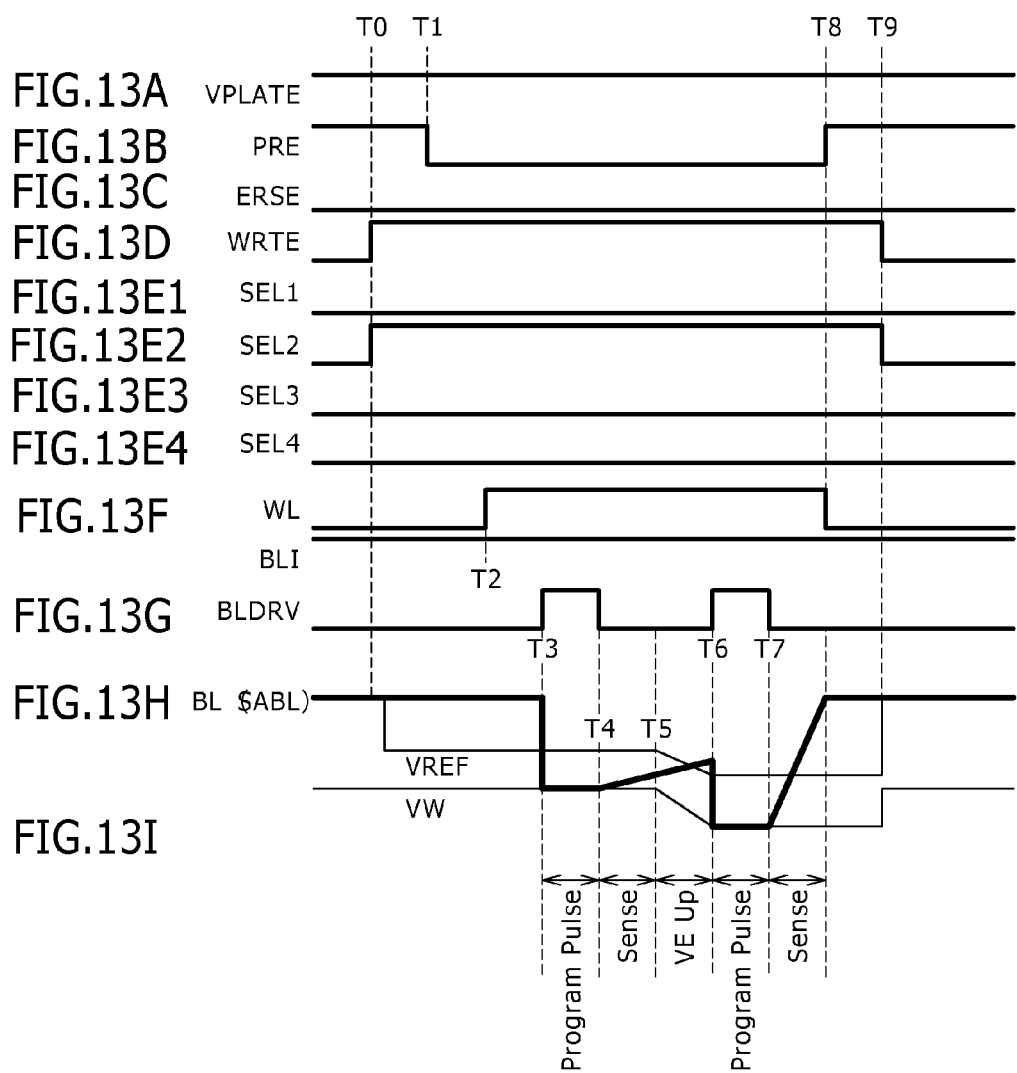
FIGS. 13A to 13I are a plurality of diagrams showing the same plurality of waveforms each representing a timing chart of a signal used in a sequence of data write operations each immediately followed by a direct verify write operation carried out in accordance with the first embodiment.

A direct verify write sequence is a sequence of data write operations and direct verify write operations which are each carried out right after application of a write pulse for carrying out one of the data write operations. FIGS. 13A to 13F are a timing diagram showing a plurality of waveforms each representing a timing chart of a signal controlled or voltage changes on a line in two consecutive direct verify write operations which are carried out in accordance with the first embodiment. To be more specific, FIGS. 13A to 13F correspond to FIGS. 11A to 11F respectively except that the waveform diagram of FIG. 13F shows the timing chart of the write BL voltage VW while the waveform diagram of FIG. 11F shows the timing chart of the erase BL voltage VE. The timing diagrams of FIGS. 13A to 13I are basically similar to the timing diagrams of FIGS. 11A to 11I except for the waveforms of the PL voltage VPLATE, the erase enable signal ERSE, the write enable signal WRTE, the reference voltage VREF and the electric potential appearing on the bit line BL (or the sense-amplifier bit line SABL).

FIGS. 13A to 13I are timing diagrams for a typical data write operation including a no-go first direct verify write operation followed by a second direct verify write operation which meets a criterion for success by virtue of a step-down process of decreasing the write BL voltage VW to be applied prior to the second direct verify write operation. In actuality, by decreasing the write BL voltage VW, the magnitude of the write pulse referred to as a program pulse in the timing diagrams of FIGS. 13A to 13I is increased. In addition, in the typical data write operation shown in the timing diagrams of FIGS. 13A to 13I, the divided-voltage select signal SEL2 is chosen from the four divided-voltage select signals SEL1 to SEL4. It is to be noted, however, that a divided-voltage select signal other than the divided-voltage select signal SEL2 can also be chosen from the four divided-voltage select signals SEL1 to SEL4.

To put it in more detail, the timing diagrams of FIGS. 13A to 13I are different from the timing diagrams of FIGS. 11A to 11I in that the PL voltage VPLATE is sustained at the H level all the time as shown in the waveform diagram of FIG. 13A. Therefore, as shown in the waveform diagram of FIG. 13I, the electric potential appearing on the bit line BL (and, thus, the sense-amplifier bit line SABL) is sustained at the H-level pre-charge electric potential even after a time T0 at which the data write operation is started after the pre-charge operation. The electric potential appearing on the bit line BL (and, thus, the sense-amplifier bit line SABL) is sustained at the H-level pre-charge electric potential till a time T3.

In addition, the timing diagrams of FIGS. 13A to 13I are different from the timing diagrams of FIGS. 11A to 11I in that the write enable signal WRTE shown in the waveform diagram of FIG. 13D is put in an active state instead of activating the erase enable signal ERSE shown in the waveform diagram of FIG. 13C. These operations are opposite to the operations shown in the timing diagrams of FIGS. 11A to 11I. That is to say, the erase enable signal ERSE shown in the waveform diagram of FIG. 11C is put in an active state instead of activating the write enable signal WRTE shown in the waveform diagram of FIG. 11D as explained earlier.

At the time T0, the write enable signal WRTE is changed from the L level to the H level. Due to the write enable signal WRTE changed from the L level to the H level, the operation-voltage generation/control circuit 15 shown in the block diagram of FIG. 5 supplies the write BL voltage VW to the write/erase driver 10. The level of the write BL voltage VW is lower than the level of the PL voltage VPLATE. In the reference-voltage generation/control circuit 14 shown in the circuit diagram of FIG. 10, on the other hand, the write transistor Tw is put in a turned-on state by the write enable signal WRTE changed from the L level to the H level whereas the erase transistor Te is sustained in a turned-off state due to the erase enable signal ERSE kept in an inactive state. Thus, at the time T0 shown in the timing diagrams of FIGS. 13A to 13I, the reference-voltage generation/control circuit 14 starts an operation to supply a divided voltage, which is generated by the write reference-voltage generation section 14W and selected by the select transistor ST2 put in a turned-on state by the divided-voltage select signal SEL2, to the sense amplifier 7 as the reference voltage VREF.

At the time T3, a positive pulse of the BL drive signal BLDRV is supplied to the write/erase driver 10 as shown in the waveform diagram of FIG. 13H in order to drive the write/erase driver 10 to pass on the write BL voltage VW received from the operation-voltage generation/control circuit 15 to the sense-amplifier bit line SABL. The write BL voltage VW passed on to the sense-amplifier bit line SABL is further forwarded to the bit line BL by way of the BLI transistor 5T which has been put in a turned-on state. Thus, as shown in the waveform diagram of FIG. 13I, the electric potential appearing on the sense-amplifier bit line SABL and the bit line BL decreases to the write BL voltage VW having a level lower than the level of the PL voltage VPLATE. As a result, since the write pulse applied to the memory cell MC has a polarity opposite to that of the erase pulse used in the data erase operation explained earlier, a write current Iw flows through the memory cell MC in a direction shown in the diagram of FIG. 3A. Accordingly, the resistance of the variable-resistance cell resistor Rcell serving as the data storage element of the memory cell MC decreases.

The decrease of the resistance of the variable-resistance cell resistor Rcell serving as the data storage element of the memory cell MC depends on how much the electric potential appearing on the sense-amplifier bit line SABL and the bit line BL increases in a sense (or read) operation carried out as the aforementioned direct verify write operation which starts at a time T4.

To put it more concretely, in the first direct verify write operation, the electric potential appearing on the sense-amplifier bit line SABL and the bit line BL does not exceed the reference voltage VREF. In this case, the decrease of the resistance of the variable-resistance cell resistor Rcell serving as the data storage element of the memory cell MC is considered to be an inadequate decrease giving rise to a data write operation which ends in failure.

Then, by carrying out the same control as the data erase operation described earlier, a second direct verify write operation is carried out as a second sense (or read) operation which starts at a time T7. In the second direct verify write operation, the electric potential appearing on the sense-amplifier bit line SABL and the bit line BL exceeds the reference voltage VREF within a short period between the time T7 and a time T8. In this case, the decrease of the resistance of the variable-resistance cell resistor Rcell serving as the data storage element of the memory cell MC is considered to be an adequate decrease giving rise to a successful data write operation which meets the criterion for success. Then, at a time T9, the data write operation is terminated.

As is obvious from the timing diagrams of FIGS. 13A to 13I, in the direct verify write sequence described above, the relation between the BL electric potential and the reference voltage VREF is opposite to the relation between the BL electric potential and the reference voltage VREF in the direct verify erase sequence described earlier. In addition, it is also obvious that, in the case of the direct verify write sequence, the write BL voltage VW is lowered down in a step-down period between the times T5 and T6 and the magnitude of the reference voltage VREF is controlled to follow the changes in write BL voltage VW.

2. Second Embodiment

IC-Chip Configuration

Figure 14:
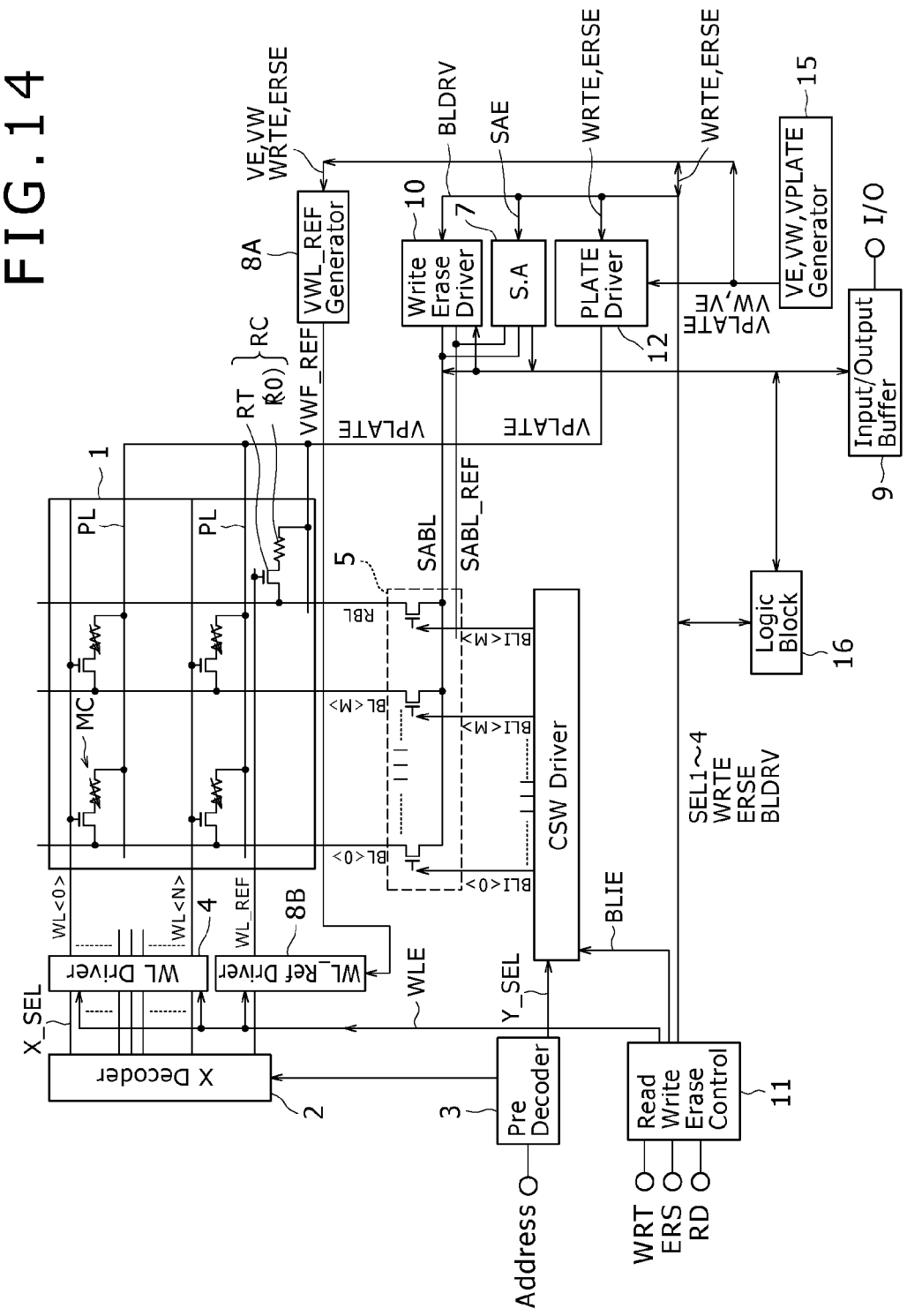
FIG. 14 is a block diagram showing the configuration of an IC chip of the variable-resistance memory device according to the second embodiment.

FIG. 14 is a block diagram showing the configuration of an IC chip of the variable-resistance memory device according to the second embodiment.

Figure 15:
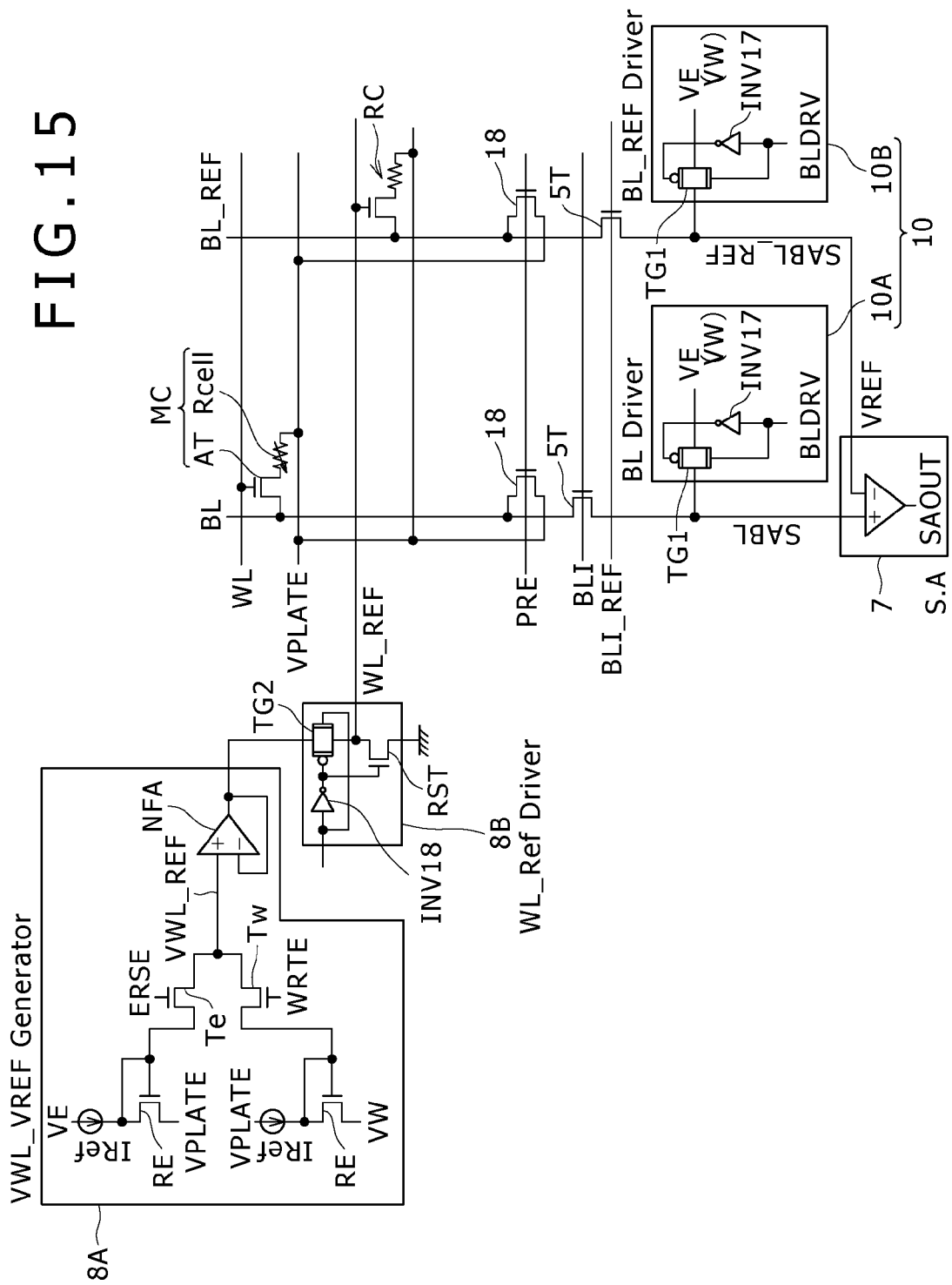
FIG. 15 is a circuit diagram showing details of mainly a read-system circuit connected to a memory cell employed in the variable-resistance memory device according to the second embodiment.

FIG. 15 is a circuit diagram showing details of mainly a read-system circuit connected to a memory cell MC, which is employed in the variable-resistance memory device according to the second embodiment, to serve as a peripheral circuit.

The following description explains only differences between the second and first embodiments by pointing out differences between the block diagrams shown in the circuit diagrams of FIGS. 14 and 5 as well as differences between the circuit diagrams shown in the circuit diagrams of FIGS. 15 and 10. The following description explains neither components common to the block diagrams shown in the circuit diagrams of FIGS. 14 and 5 nor components common to the circuit diagrams shown in the circuit diagrams of FIGS. 15 and 10.

Much like the variable-resistance memory device shown in the block diagram of FIG. 5, the variable-resistance memory device shown in the block diagram of FIG. 14 employs a memory array 1 and peripheral circuits of the memory array 1. Also much like the variable-resistance memory device shown in the block diagram of FIG. 5, the peripheral circuits shown in the block diagram of FIG. 14 include an X-address decoder 2, a pre-decoder 3, a WL driver 4, a BLI switch 5 and a CSW driver 6. In addition, much like the variable-resistance memory device shown in the block diagram of FIG. 5, the peripheral circuits shown in the block diagram of FIG. 14 also employ an SA (sense amplifier) 7 provided for each of the columns, an I/O (input/output) buffer 9, a write/erase driver 10, a control circuit 11, a plate driver 12, and a VE, VW, VPLATE generator serving as the operation-voltage generation/control circuit 15.

In place of the reference-voltage generation/control circuit 14 shown in the block diagram of FIG. 5, the variable-resistance memory device shown in the block diagram of FIG. 14 employs a WL reference-voltage generation/control circuit 8A and a WL reference-voltage driving circuit 8B which are included in the drive/control section. In the block diagram of FIG. 14, the WL reference-voltage generation/control circuit 8A is shown as a VWL_REF generator whereas the WL reference-voltage driving circuit 8B is shown as a WL_Ref driver.

In addition, the memory array 1 shown in the block diagram of FIG. 14 includes a reference-voltage memory cell RC, a reference-voltage bit line RBL and a reference-voltage word line RWL. The reference-voltage memory cell RC employs a reference-voltage transistor RT and a reference-voltage resistor RO. The source (or the drain) of the reference-voltage transistor RT employed in the reference-voltage memory cell RC is connected to the reference-voltage bit line RBL whereas the drain (or the source) of the reference-voltage transistor RT is connected to the plate line PL through the reference-voltage resistor RO. The gate of the reference-voltage transistor RT is connected to the reference-voltage word line RWL.

Much like the reference-voltage generation/control circuit 14 employed in the variable-resistance memory device according to the first embodiment shown in the block diagram of FIG. 5, the WL reference-voltage generation/control circuit 8A receives the erase BL voltage VE or the write BL voltage VW from the operation-voltage generation/control circuit 15 and also receives the erase enable signal ERSE or the write enable signal WRTE from the control circuit 11.

The WL reference-voltage generation/control circuit 8A outputs an original WL reference-voltage signal VWL_REF to the WL reference-voltage driving circuit 8B. The WL reference-voltage driving circuit 8B makes use of the WL reference-voltage signal VWL_REF to generate a WL reference voltage WL_REF to be supplied to the reference-voltage transistor RT of the reference-voltage memory cell RC through the reference-voltage word line RWL. In the following description, the WL reference voltage WL_REF is also referred to as an RWL voltage in order to distinguish the voltage from the WL reference-voltage signal VWL_REF.

Under control according to a select signal generated by the X decoder 2 and/or a WL select enable signal WLE generated by the control circuit 11, the WL reference-voltage driving circuit 8B is activated to supply the WL reference voltage WL_REF to the reference-voltage transistor RT of the reference-voltage memory cell RC through the reference-voltage word line RWL.

As shown in the circuit diagram of FIG. 15, the WL reference-voltage generation/control circuit 8A employs a constant-current source and a reference-voltage element RE which are provided for the data erase operation as well as a constant-current source and a reference-voltage element RE which are provided for the data write operation.

In the data erase operation, a reference current IRef generated by the constant-current source driven by the erase BL voltage VE flows to an erase transistor Te by way of the reference-voltage element RE provided for the data erase operation to function as a reference resistor. In the data write operation, on the other hand, a reference current IRef generated by the constant-current source driven by the write BL voltage VW flows to a write transistor Tw by way of the reference-voltage element RE provided for the data write operation to function as a reference resistor. The reference-voltage element RE is typically an NMOS transistor with the drain and gate thereof wired to each other to work as a diode.

At the junction point between the constant-current source and the reference-voltage element RE functioning as a diode, the WL reference-voltage signal VWL_REF cited above is generated and supplied to the non-inverting input node "+" of a negative feedback amplifier NFA by way of the erase transistor Te put in a turned-on state by the erase enable signal ERSE in the data erase operation or the write transistor Tw put in a turned-on state by the write enable signal WRTE in the data write operation. The inverting input node "−" of the negative feedback amplifier NFA is wired to the output node of the negative feedback amplifier NFA. In this configuration, the negative feedback amplifier NFA serves as a circuit for stabilizing the WL reference-voltage signal VWL_REF before supplying the WL reference-voltage signal VWL_REF to the WL reference-voltage driving circuit 8B.

As shown in the circuit diagram of FIG. 15, the WL reference-voltage driving circuit 8B employs an inverter INV18, a transfer gate circuit TG2 and a reset transistor RST. The inverter INV18 receives a select signal generated by the X decoder 2 shown in the block diagram of FIG. 14 or the WL select enable signal WLE generated by the control circuit 11 also shown in the block diagram of FIG. 14 and inverts the input signal. Then, the inverter INV18 supplies the inverted signal to the gate of a PMOS transistor employed in the transfer gate circuit TG2. The gate of an NMOS transistor employed in the transfer gate circuit TG2 is wired to the input node of the inverter INV18.

The transfer gate circuit TG2 is provided between the output node of the negative feedback amplifier NFA and the reset transistor RST. To put it in detail, the input node of the transfer gate circuit TG2 is connected to the output node of the negative feedback amplifier NFA whereas the output node of the transfer gate circuit TG2 is connected to the source (or the drain) of the reset transistor RST. The gate of the reset transistor RST is wired to the output node of the inverter INV18.

In the configuration of the WL reference-voltage driving circuit 8B described above, when the transfer gate circuit TG2 is put in a turned-off state, the reset transistor RST is put in a turned-on state. With the transfer gate circuit TG2 put in a turned-off state putting the reset transistor RST in a turned-on state, the reset transistor RST resets the WL reference-voltage driving circuit 8B by connecting the reference-voltage word line RWL to the ground.

It is to be noted that, in the variable-reference memory device according to the second embodiment shown in the block diagram of FIG. 15, in place of the write/erase driver 10 employed in the variable-reference memory device according to the first embodiment shown in the block diagram of FIG. 10, a BL driver 10A and a newly added reference-voltage BL driver 10B are employed. In the same way as the write/erase driver 10 employed in the variable-reference memory device according to the first embodiment shown in the block diagram of FIG. 10, the BL driver 10A applies the erase BL voltage VE or the write BL voltage VW to the sense-amplifier bit line SABL. On the other hand, the newly added reference-voltage BL driver 10B having the same configuration as the BL driver 10A applies the erase BL voltage VE or the write BL voltage VW to a reference-voltage sense-amplifier bit line SABL_REF connected to a reference-voltage bit line BL_REF through a BLI transistor 5T employed in the BLI switch 5 shown in the block diagram of FIG. 14. The reference-voltage sense-amplifier bit line SABL_REF and the reference-voltage bit line BL_REF provided specially for the reference-voltage memory cell RC. The reference-voltage sense-amplifier bit line SABL_REF is also connected to the reference-voltage node of the sense amplifier 7 to serve as a line for conveying a reference voltage VREF.

In the configuration of the variable-reference memory device according to the second embodiment shown in the block diagram of FIG. 15, for example, the reference-voltage memory cell RC can be driven so that the reference-voltage memory cell RC generates the constant reference current IRef generated in the WL reference-voltage generation/control circuit 8A in a mirror generation process (or a pseudo generation process) in order to generate the reference voltage VREF to be supplied to the reference-voltage node of the sense amplifier 7. That is to say, control is carried out so that a current having a magnitude about equal to the magnitude of the reference current IRef flows to the reference-voltage memory cell RC. By carrying out such control, it is possible to adjust the H level appearing on the gate of the reference-voltage transistor RT employed in the reference-voltage memory cell RC or, in other words, it is possible to adjust the magnitude of the WL reference-voltage signal VWL_REF to be supplied to the reference-voltage word line RWL as the WL reference voltage WL_REF. Then, since the current having a magnitude about equal to the magnitude of the reference current IRef flows through the reference-voltage memory cell RC, the reference-voltage bit line BL_REF and, thus, the reference-voltage sense-amplifier bit line SABL_REF are electrically discharged, supplying a variable reference voltage VREF to the sense amplifier 7.

Sequence of Operations

FIGS. 16A to 16I are a plurality of diagrams showing the same plurality of waveforms each representing a timing chart of a signal used in a sequence of data erase operations each immediately followed by a direct verify erase operation carried out carried out in accordance with the second embodiment. FIGS. 17A to 17I are a plurality of diagrams showing the same plurality of waveforms each representing a timing chart of a signal used in a sequence of data write operations each immediately followed by a direct verify write operation carried out in accordance with the second embodiment. Control is executed by generation of signals in the timing diagrams of FIGS. 16A to 16I in a way identical with that of the timing diagrams of FIGS. 11A to 11I whereas control is carried out by generation of signals in the timing diagrams of FIGS. 17A to 17I in a way identical with that of the timing diagrams of FIGS. 13A to 13I.

However, in the case of the data erase operation, some signal changes shown in the waveform diagram of FIG. 16I for the second embodiment are different from those shown in the waveform diagram of FIG. 11I for the first embodiment due to a difference in way of generating the reference voltage VREF between the first and second embodiments. By the same token, in the case of the data write operation, some signal changes shown in the waveform diagram of FIG. 17I for the second embodiment are different from those shown in the waveform diagram of FIG. 13I for the first embodiment due to the difference in way of generating the reference voltage VREF between the first and second embodiments.

To put it more concretely, in the waveform diagram of FIG. 16I for the sequence of data erase operations and the waveform diagram of FIG. 17I for the sequence of data write operations, during a first sense period allocated to a first direct verify operation starting at a time T4 and a second sense period allocated to a second direct verify operation starting at a time T7, a bold line pointed to by an arrow denoted by reference notation (MC) represents the electric potential appearing on the sense-amplifier bit line SABL connected to the memory cell MC through the bit line BL. The gradient of the bold line (MC) reflecting the electrical discharging process of the bit line BL and the sense-amplifier bit line SABL in the first sense period is different from the gradient of the bold line (MC) in the second sense period due to a difference in MC (memory cell) state between the first and second sense periods. In this case, the MC state is the resistance of the variable-resistance cell resistor Rcell employed in the memory cell MC.

On the other hand, a thin line pointed to by an arrow denoted by reference notation (RC) represents the electric potential appearing on the reference-voltage sense-amplifier bit line SABL_REF connected to the reference-voltage memory cell RC through the reference-voltage bit line BL_REF. The gradient of the thin line (RC) reflecting the electrical discharging process of the reference-voltage bit line BL_REF and the reference-voltage sense-amplifier bit line SABL_REF in the first sense period is equal to the gradient of the thin line (RC) in the second sense period to due to no difference in RC (reference-voltage memory cell) state between the first and second sense periods. In this case, the RC state is the always fixed resistance of the reference-voltage resistor RO employed in the reference-voltage memory cell RC which does not have a variable-resistance cell resistor Rcell serving as a data storage element.

The sense amplifier 7 compares the electric potential appearing on the sense-amplifier bit line SABL with the electric potential appearing on the reference-voltage sense-amplifier bit line SABL_REF to serve as the reference voltage VREF in order to determine whether the application of the update (that is, erase or write) pulse to the memory cell MC prior to the direct verify operation has been successful or has been ended in failure in erasing data from the memory cell MC or writing data into the memory cell MC. As shown in the waveform diagrams of FIGS. 16I and 17I, in the first direct sense period allocated to the first direct verify operation between the time T4 and a time T5, the electric potential appearing on the sense-amplifier bit line SABL is found lower than the electric potential appearing on the reference-voltage sense-amplifier bit line SABL_REF to serve as the reference voltage VREF. In this case, the sense amplifier 7 outputs an SA output signal SAOUT indicating that the application of the first update (that is, erase or write) pulse to the memory cell MC prior to the first direct verify operation has been ended in failure in erasing data from the memory cell MC or writing data into the memory cell MC. In the second period allocated to the second direct verify operation between the time T7 and a time T8, on the other hand, the electric potential appearing on the sense-amplifier bit line SABL is found higher than the electric potential appearing on the reference-voltage sense-amplifier bit line SABL_REF to serve as the reference voltage VREF. In this case, the sense amplifier 7 outputs an SA output signal SAOUT indicating that the application of the second update (that is, erase or write) pulse to the memory cell MC prior to the second direct verify operation has been successful in erasing data from the memory cell MC or writing data into the memory cell MC.

In accordance with the first and second embodiments described above, even if an update (that is, erase or write) pulse changes, a direct verify operation carried out immediately after application of the update pulse to the memory cell MC to implement an update (that is, erase or write) operation hardly produces an incorrect result of determination as to whether the application of the update pulse prior to the direct verify operation has been successful or has been ended in failure in erasing data from the memory cell MC or writing data into the memory cell MC. It is thus possible to provide a variable-resistance memory device capable of operating with a high degree of reliability.

A variety of modified versions of the first and second embodiments provided by the present invention as described above are explained as follows.

3. Modified Versions

3-1. First Modified Version

The function executed by the write/erase driver 10 (also referred to as the bit-line driver) in accordance with the first and second embodiments of the present invention as described above can also be carried out by the plate driver 12. In this modified version, the bit line BL is sustained by the write/erase driver 10 at a constant voltage in data erase and write operations. As described above, in the case of the first and second embodiments, the write/erase driver 10 passes on a variable erase BL voltage VE in a data erase operation or a variable write BL voltage VW in a data write operation from the operation-voltage generation/control circuit 15 to the bit line BL.

In addition, it is also possible to provide a configuration in which the write/erase driver 10 outputs a variable erase BL voltage VE or a variable write BL voltage VW to the bit line BL whereas the plate driver 12 outputs a variable PL voltage VPLATE to the plate line PL in data erase and write operations. Also in the case of this configuration, variable erase and write pulses are virtually applied to the memory cell MC.

3-2. Second Modified Version

The control to gradually increase the operation voltage can also be carried out by the write/erase driver 10 (also referred to as the bit-line driver), the plate driver 12 or both the write/erase driver 10 and the plate driver 12. Each of the first and second embodiments described above is no more than a typical implementation in which the control to gradually increase the operation voltage is carried out by the operation-voltage generation/control circuit 15.

3-3. Third Modified Version

Implementations of the present invention are by no means limited to the first embodiment shown in the block diagram of FIG. 5 as an embodiment including a reference-voltage generation/control circuit 14 having divided-voltage select circuits which each employ divided-voltage select transistors ST1 to ST4 as shown the circuit diagram of FIG. 10.

Each of the divided-voltage select circuits provided for the data erase and write operations respectively is a circuit which adjusts the reference voltage VREF in accordance with a difference between the BL electric potential appearing on the bit line BL as an erase BL voltage VE or a write BL voltage VW and the electric potential of the PL voltage VPLATE appearing on the plate line PL. Each of the divided-voltage select circuits adjusts the reference voltage VREF in accordance with a difference between the BL electric potential and the electric potential of the PL voltage VPLATE because the BL electric potential may be changed during a step-up or step-down period as described before. That is to say, due to variations of elements composing the IC chip and other causes, by merely making use of predetermined voltage division ratios for the divided-voltage select circuits, execution of each of the data erase and write operations may not result in a desired state of the memory cell MC in some cases. As described above, in this context, the state of a memory cell MC means the resistance of the variable-resistance cell resistor Rcell employed in the memory cell MC to serve as a data storage element. In order to avoid the cases in which execution of each of the data erase and write operations does not result in a desired state of the memory cell MC, in the first and second embodiments, the reference voltage VREF is adjusted in order to change a determination criterion provided for the direct verify operation to be used as a criterion as to whether application of an update (that is, erase or write) pulse to the memory cell MC prior to the direct verify operation has been successful or has been ended in failure in erasing data from the memory cell MC or writing data into the memory cell MC. Thus, by making use of this function to adjust the reference voltage VREF, it is possible to get benefit from a merit that a data erase operation or a data write operation can be carried out to always result in an intended resistance of the variable-resistance cell resistor Rcell serving as the data storage element employed in the memory cell MC.

If a desired state of the memory cell MC can always be obtained by making use of a voltage division ratio set at a design time even if there are a number variations of elements composing the IC chip and a number of other causes, the resistor string RS can be constructed to include two resistors. In this case, a voltage generated at the junction node between the two resistors can be used as the reference voltage VREF as it is. Thus, it is possible to offer a merit that the configuration of the reference-voltage generation/control circuit 14 can be made simple.

In addition, in order to adjust the reference voltage VREF, instead of making use of a divided-voltage select circuit, it is possible to adopt a configuration in which two resistors are connected to each other in series and a variable resistor is used as one of the two resistors.

On top of that, methods for controlling the reference voltage VREF are by no means limited to the method adopted by the first embodiment. In accordance with the method adopted by the first embodiment, the reference voltage VREF is set at a level which follows changes in operation voltage. To put it in detail, the reference voltage VREF is adjusted to a level set at one of predetermined fractions of a BL electric-potential amplitude which is equal to a voltage difference (VE−VPLATE) for the data erase operation or a voltage difference (VPLATE−VW) for the data write operation where reference notations VE, VW and VPLATE used in the expressions of a voltage difference denote the erase BL voltage VE, the write BL voltage VW and the PL voltage VPLATE respectively. For example, it is also possible to devise another circuit configuration of the reference-voltage generation/control circuit 14 for implementing another VREF control method. In accordance with the other VREF control method adopted by the other circuit configuration of the reference-voltage generation/control circuit 14, the reference voltage VREF is controlled on the basis of the BL electric potential in such a way that the difference between the electric potential of the reference voltage VREF and the BL electric potential is constant.

3-4. Fourth Embodiment

Configurations for carrying out control of generation of a reference current are by no means limited to the typical circuit designed for the second embodiment as shown in the circuit diagram of FIG. 15.

For example, an ordinary constant-resistance resistor can be employed in place of the reference-voltage element RE. In the case of an NMOS transistor employed to serve as the reference-voltage element RE as is the case with the circuit diagram of FIG. 15, however, the variations of the reference-voltage element RE have the same directions as the variations of the reference-voltage transistor RT employed in the reference-voltage memory cell RC shown in the circuit diagram of FIG. 15. Thus, the typical circuit shown in the circuit diagram of FIG. 15 offers a merit that effects of the variations of the reference-voltage element RE and the variations of the reference-voltage transistor RT can be eliminated.

On the other hand, a variable-resistance resistor can be employed in place of the reference-voltage element RE in order to adjust the reference voltage VREF in an attempt to compensate the reference voltage VREF for the variations of the reference-voltage element RE, the variations of the reference-voltage transistor RT and variations due to other causes.

After all, it is possible to adopt any configuration for carrying out control of generation of the reference voltage VREF as long as the configuration is capable of generating the reference voltage VREF in accordance with the product of a constant current and the resistance of an element through which the constant current flows.

3-5. Fifth Embodiment

Configurations of the IC chip of the variable-resistance memory device are by no means limited to those shown in FIGS. 10 and 14 for the first and second embodiments respectively.

For example, it is possible to provide a configuration in which the variable-resistance memory device includes a plurality of memory arrays each having the same configuration as the memory array 1 explained before and a control-system circuit provided for the memory arrays to serve as a common circuit shared by the memory arrays.

The present application contains subject matter related to that disclosed in Japanese Priority Patent Application JP 2009-103907 filed in the Japan Patent Office on Apr. 22, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A variable-resistance memory device comprising:
   (a) memory cells each having a current path including an access transistor and a data storage element connected to said access transistor in series, the data storage element storing a data in accordance with a resistance variation thereof caused by a voltage applied to said memory cell;
   (b) first wires each connected to a specific one of the two ends of said current path;
   (c) a second wire connected to the other one of said two ends of said current path;
   (d) a drive/control section configured to drive and control
      (1) a data write operation to write data into said memory cell by applying a write pulse between said first and second wires in order to cause a write cell current to flow through said memory cell,
      (2) a data erase operation to erase data from said memory cell by applying an erase pulse between said first and second wires in order to cause an erase cell current to flow through said memory cell, and
      (3) a direct verify operation to float said first wire right after said data write operation or right after said data erase operation in order to cause a read cell current to flow through said memory cell; and
   (e) a sense amplifier for sensing an electric-potential change generated on said first wire caused in said direct verify operation by taking a reference voltage, which is generated by said drive/control section in accordance with the operation voltage of said write or erase pulse, as a comparison reference.

2. The variable-resistance memory device according to claim 1, further comprising:
   an operation-voltage generation/control circuit included in said drive/control section to serve as a voltage generation/control circuit configured to generate said write or erase pulse and change the operation voltage of said write or erase pulse in accordance with a result of a sensing operation carried out by said sense amplifier on the basis of said control executed by said drive/control section to drive said direct verify operation and/or in accordance with the number of said sensing operations carried out so far; and
   a reference-voltage generation/control circuit also included in said drive/control section to serve as a voltage generation/control circuit configured to generate a reference voltage to be supplied to said sense amplifier and change said reference voltage in accordance with a change of said operation voltage.

3. The variable-resistance memory device according to claim 2, wherein:
   said reference-voltage generation/control circuit employs a resistor string, which includes a plurality of resistors connected to each other in series, and a select circuit;
   with said operation voltage applied to said resistor string as a bias, said select circuit generates a plurality of voltages with the magnitudes thereof different from each other at the same plurality of taps each located at a connection point between every two of said resistors composing said resistor string;
   from said generated voltages, said select circuit selects a voltage having a magnitude corresponding to a voltage-division select signal supplied to said select circuit; and
   said select circuit outputs said selected voltage to said sense amplifier as said reference voltage.

4. The variable-resistance memory device according to claim 2, wherein:
   said reference-voltage generation/control circuit employs a resistor string including a plurality of resistors connected to each other in series; and
   with said operation voltage applied to said resistor string as a bias, a voltage generated at a tap between any two of said resistors composing said resistor string is supplied to said sense amplifier as said reference voltage.

5. The variable-resistance memory device according to claim 1, further comprising:
   a reference line:
   a reference-voltage cell, which is connected between said reference line and said second wire to include a reference-voltage transistor; and
   a reference-voltage generation/control circuit, wherein,
      said reference-voltage cell generates said reference voltage to be supplied to said sense amplifier, and
      said reference-voltage generation/control circuit changes said reference voltage in accordance with said operation voltage.

6. The variable-resistance memory device according to claim 5, further comprising:
   an operation-voltage generation/control circuit included in said drive/control section to serve as a voltage generation/control circuit configured to generate said write or erase pulse and change said operation voltage in accordance with a result of a sensing operation carried out by said sense amplifier on the basis of said control executed by said drive/control section to drive said direct verify operation and/or in accordance with the number of said sensing operations carried out so far; and
   a reference-voltage generation/control circuit also included in said drive/control section to serve as a voltage generation/control circuit configured to generate a reference voltage to be supplied to said sense amplifier from the reference-voltage cell and change said reference voltage in accordance with a change of said operation voltage.

7. The variable-resistance memory device according to claim 6, wherein said reference-voltage generation/control circuit:
   has a current source for generating a reference current and has a reference element driven by said reference current; and
   controls said reference-voltage transistor of said reference-voltage cell provided between said reference line and said second wire on the basis of a voltage appearing at a junction node between said current source and said reference element in order to adjust the resistance of said reference-voltage cell so as to control a cell current which flows through said reference-voltage cell to generate said reference voltage.

8. The variable-resistance memory device according to claim 1, wherein:
   said data storage element has two electrodes;
   between said two electrodes, an ion supplying layer is superposed on a storage layer to form a laminated body;
   said storage layer is made of an insulation material; and
   said ion supplying layer includes at least one of Cu, Ag and Zn and at least one of S, Se and Te.

9. A method for operating a variable-resistance memory device including a memory cell having a current path including a data storage element, the data storage element storing a data in accordance with a resistance variation thereof caused by a voltage applied to said memory cell, said method comprising:

a pulse application step of applying a write pulse or an erase pulse to said memory cell between a first wire connected to a specific one of the two ends of said current path and a second wire connected to the other one of said two ends of said current path to serve as a pulse resulting in a difference in electric potential between said first and second wires; and a direct verify step of
  (a) sustaining a state of applying said write or erase pulse to said memory cell between said first and second wires,
  (b) putting said first wire in a high-impedance state, and
  (c) detecting an electrical change occurring on said first wire as a change caused by a read current, which flows through said data storage element, by sustaining said high-impedance state of said first wire and by taking a reference voltage generated in accordance with the operation voltage of said write or erase pulse applied to said memory cell as a comparison reference.

10. The method for operating the variable-resistance memory device in accordance with claim 9, further comprising a reference-voltage generation/control step of generating said reference voltage and changing said reference voltage in accordance with the operation voltage of said write or erase pulse applied to said memory cell between said first and second wires.

11. The method for operating the variable-resistance memory device in accordance with claim 10, wherein said reference-voltage generation/control step is executed to change said reference voltage in accordance with a selected output of a potentiometer to which said write or erase pulse is applied.

12. The method for operating the variable-resistance memory device in accordance with claim 10, wherein said reference-voltage generation/control step is executed to change said reference voltage by controlling the resistance of an electrical discharge path created between a node, at which said reference voltage is to be generated, and said second wire in accordance with the operation voltage of said write or erase pulse applied to said memory cell between said first and second wires.

13. The method for operating the variable-resistance memory device in accordance with claim 12, wherein said reference-voltage generation/control step of changing said reference voltage is executed to generate a voltage for controlling said resistance of said electrical discharge path in accordance with a product of the resistance of an element for generating a constant current and said constant current.

* * * * *